United States Patent
Ikeda

(10) Patent No.: US 6,324,224 B1
(45) Date of Patent: Nov. 27, 2001

(54) APPARATUS AND METHOD FOR RECEIVING DATA WITH BIT INSERTION

(75) Inventor: Tamotsu Ikeda, Tokyo (JP)

(73) Assignee: Sony Corporation (JP)

(*) Notice: Subject to any disclaimer, the term of this patent is extended or adjusted under 35 U.S.C. 154(b) by 0 days.

(21) Appl. No.: 08/920,318

(22) Filed: Aug. 27, 1997

(30) Foreign Application Priority Data

Sep. 3, 1996 (JP) ................................. 8-233057

(51) Int. Cl.$^7$ ............................. H03D 1/00; H04L 27/06
(52) U.S. Cl. ............................ 375/341; 375/262
(58) Field of Search .......................... 375/341, 260; 371/43.4

(56) References Cited

U.S. PATENT DOCUMENTS

| | | | |
|---|---|---|---|
| 5,134,635 | 7/1992 | Hong et al. | 375/94 |
| 5,204,874 | 4/1993 | Falconer et al. | 375/1 |
| 5,438,590 | 8/1995 | Tzukerman et al. | 375/259 |

FOREIGN PATENT DOCUMENTS 0 537 706 A2  4/1993  (EP).

OTHER PUBLICATIONS

International Telecommunication Union, Radiocommunication Study Groups Document 11–3/43–E, Aug. 29, 1996. IS95A, May 1995.*
Yasuda et al., XP 000644974, IEEE Transactions on Communications, vol. COM–32, No. 3, pp. 315–319 (Mar. 1, 1994).
Caire et al., XP 000620676, Electronics Letters, vol. 32 No. 12, pp. 1060–1061 (Jun. 6, 1996).

* cited by examiner

Primary Examiner—William Luther
(74) Attorney, Agent, or Firm—Lerner, David, Littenberg, Krumholz & Mentlik, LLP

(57) ABSTRACT

A message is encoded in a punctured convolutional code by an encoding process involving bit erasure and transmitted in a multi-component modulation system such as 16-QAM in which each component of a signal denotes values for more than one bit. At the receiver, a bit metric calculation circuit calculates a bit metric for each bit of data denoted by each received signal. The resulting sequences of bit metrics undergo bit insertion processing to yield one or more augmented sequences of bit metrics corresponding to the encoded message before bit erasure. The one or more augmented sequences of bit metrics are subjected to most-likelihood decoding scheme such as Viterbi decoding.

30 Claims, 19 Drawing Sheets

APPARATUS AND METHOD FOR RECEIVING DATA WITH BIT INSERTION

FIELD OF THE INVENTION

The present invention relates to an apparatus and a method for receiving data and, more particularly, to a data receiver and a data receiving method for receiving multi-component signals representing values for several data bits.

BACKGROUND OF THE INVENTION

In the U.S.A., digital broadcasting bas already been started. Also in Europe, the organization for standardization "Digital Video Broadcasting (DVB)" has been formed to introduce digital TV broadcasting and its standard system is now being made. Such digital broadcasting is described, for example, in "Europe set to start digital satellite broadcasting in 1996 after successful U.S. nationwide services", NIKKEI ELECTRONICS 1.15, 1996 (No. 653), pp. 139–151.

In digital broadcasting and in other types of data transmission, it is desirable to minimize the power in the signal. This in turn reduces the ratio of signal power to noise power, and increases the probability of transmission errors. An error-correcting code is used to obtain a coding gain which compensates for this effect. Ordinarily, in a system using such a method, error-correcting coding is performed on the transmitting side while error-correcting decoding is performed on the receiving side.

A convolutional code is particularly advantageous for transmission on a communication path with a low signal power to noise power ratio (S/N ratio). As further explained below, a convolutional code effectively spreads the information contained in each bit of the original message into several bits of the transmitted signal. The receiver determines the value of each original bit from the received signals representing the bits of the transmitted signal. Because the transmitted signal contains redundant information, the original bit values can still be determined with good accuracy even if some of the bit values in the transmitted signal are corrupted by noise in the transmission path. The receiver can use a probabilistic or "soft" decoding scheme. If a most likely path decoding method such as Viterbi decoding is used, soft decision decoding can be performed easily and a high coding gain can be obtained.

In a "punctured" convolutional code, a sequence of bits output from a convolutional encoder is thinned out by deleting some of the bits in accordance with a certain rule. Thus, the redundancy introduced by convolutional encoding is reduced, and a plurality of code rates can be achieved easily.

It is also possible to improve tolerance to noise in a transmission path by diffusing bits of an encoded signal, such as the bits of a code sequence output from a punctured convolutional code encoder, in accordance with a certain rule. "Diffusing" in this context refers to shuffling or reordering the bits.

FIG. 9 shows an example of a transmitter proposed in accordance with the standard DVB-T for DVB ground wave television. This transmitter uses a punctured convolutional code, bit diffusion and a quadrature phase-shift keying (QPSK) system.

In the example shown in FIG. 9, serial data output from an information source 1 is input to a convolutional encoder 2, and mother code sequences X and Y are generated by the encoder 2. Each of X and Y represents a 1-bit code sequence. Thus, each bit of original data from information source 1 results in generation of two bits of mother code data; one bit in sequence X, and one bit in sequence Y. Stated another way, in this example, the code rate of convolutional encoder 2 is set to 1/2.

FIG. 10 shows an example of the convolutional encoder 2. The particular encoder 2 is not arranged in accordance with the DVB-T standard; it is a simple encoder intended for explanation of the principle of convolutional processing. In this example, 1-bit serial data output from an information source 1 is input through a terminal 21, delayed one clock cycle by each of delay circuits 22 and 23 and thereafter output to adder circuits 24 and 25. The output from terminal 21 and the output from delay circuit 22 are also supplied to the adder circuit 24. Adder circuit 24 adds these groups of data together (by exclusive OR operation) and outputs the result of this addition as data X through a terminal 26. Adder circuit 25 adds the output from the terminal 21 and the output from the delay circuit 23 together (by exclusive OR operation) and outputs the result of this addition as data Y through a terminal 27.

In this example, the two mother code bits X and Y which are obtained when one original bit is input at terminal 21 will depend on the internal state of the delay circuits 22 and 23 prior to arrival of that original bit. The state of the delay circuits 22 and 23 in turn will depend upon the values of the bits which were previously supplied through terminal 21. Stated another way, the information in each bit of the original message is spread among several bits of the mother code sequences. In this example, the constraint length is 3, the number of internal delay elements is 2, the number of states is 4, and the code rate is 1/2.

FIG. 11 is a state diagram showing state transitions of the convolutional encoder shown in FIG. 10. If an original code bit with value 0 is input through terminal 21 when the state is 00 (when each of the outputs of the delay elements 22 and 23 is 0), (XY)=(00) is output through the terminals 26 and 27. That is, mother code bit 0 is output as data X through terminal 26, whereas mother code bit 0 is output as data Y through terminal 27. The state is also 00 after the transition resulting from the 0 input; the outputs of each of delay elements 22 and 23 remain 0. In the case where 1 is input when the state is 00, (XY)=(11) is output and the state changes to 10. In the case where 0 is input when the state is 01, (XY)=(11) is output and the state changes to 00. In the case where 1 is input when the state is 01, (XY)=(00) is output and the state changes to 10.

The inputs and outputs associated with these and other states are shown in FIG. 11 as expressions such as "1/01", denoting input/outputs. In each such expression, the first digit represents the input, whereas the second digit represents the X output resulting from that input and the last digit represents the Y output resulting from the input.

The mother code sequences X and Y provided by convolutional encoder 2 are input to a bit erase circuit 3, which performs bit erasing in accordance with a predetermined rule, and forms the remaining bits into a serial bit stream constituting a punctured convolutional code message. The bit erase circuit 3 erases data at predetermined positions in the mother code sequences (XY), in accordance with an erase map:

X: 10
Y: 11

Bits corresponding to 1 in the erase map are transmitted but bits corresponding to 0 in the map are not transmitted (erased). Stated another way, every other bit in the X mother code sequence is omitted from the serial bit stream formed by the bit erase circuit. Thus, if the outputs of convolutional encoder 2 in response to two successive inputs are X1, Y1 in response to the first input and X2, Y2 in response to the next input, the bit erase circuit will transmit a serial stream X1Y1Y2. The same series of operations is repeated during every two successive clock cycles of the apparatus.

The bit erase circuit reduces redundancy in the coded message and thus changes the code rate. Considering the convolutional encoder and the bit erase circuit together, the number of bits in the original message input to the convolutional encoder 2 is 2 and the number of bits in the punctured convolutional code output from the bit erase circuit 3 is 3, so that the code rate is 2/3.

The bit stream or serialized punctured convolutional code sequence output from the bit erase circuit 3 is input to a serial-parallel converter 4. Serial-parallel converter 4 converts one input data sequence X1, Y1, Y2, . . . into two data sequences (x, y).

The data sequences x and y from converter 4 undergo bit diffusion in bit diffusion circuits 5-1 and 5-2. The order of bits is in each sequence is diffusively changed (made complex). Each of the bit diffusion circuits 5-1 and 5-2 performs bit diffusion by changing the order of the bits in data sequence x or y in accordance with a predetermined rule. Ordinarily, the rules applied by the bit diffusion circuits 5-1 and 5-2 are different from each other.

In an example of such bit diffusion, M bits of input data is assumed to be one block, and a suitable value s is set. The bit diffusion process is performed by replacing a vector formed of an M-bit input sequence:

(B0, B1, . . . , Bk, . . . , BM-1) with a vector formed of an M-bit output sequence after diffusion:

(B'0, B'1, . . . , B'n, . . . , B'M-1), where B'n=Bk (n=k+s mod M).

The bit diffusion circuits 5-1 and 5-2 may use the same algorithm with different values of s.

Data sequences x' and y' after bit diffusion, constituting a diffused punctured convolutional code message, are output from the bit diffusion circuits 5-1 and 5-2, and input to a signal point assignment circuit 6.

Signal point assignment circuit 6 outputs coordinate data I' and Q' of signal points representing an in-phase component (I component) and a quadrature component (Q component) orthogonal to each other. For example, the assignment of data (x', y') as signals in the transmission channel is performed on the basis of the quadrature phase shift keying (QPSK) symbol set as shown in FIG. 12. That is, the data is assigned so that when (x', y')=(0, 0), (I', Q')=(1/$\sqrt{2}$, 1/$\sqrt{2}$) is set;
when (x', y')=(0, 1), (I', Q')=(1/$\sqrt{2}$, -1/$\sqrt{2}$) is set;
when (x', y')=(1, 0), (I', Q')=(-1/$\sqrt{2}$, 1/$\sqrt{2}$) is set; and
when (x', y')=(1, 1), (I', Q')=(-1/$\sqrt{2}$, -1/$\sqrt{2}$) is set. Each set of components (I',Q') constitutes one QPSK symbol. Each such symbol includes a first component I' denoting the value of one bit x' in the diffused punctured convolutional code message and a second component Q' denoting the value of another bit y' in the diffused punctured convolutional code message.

A symbol diffusion circuit 7 reorders the QPSK symbols prescribed by data I' and Q' output from the signal point assignment circuit 6 to obtain symbols S (I, Q). This diffusion processing increases resistance of the system to burst errors in the transmission path. The diffusion circuit changes the order of symbols S' represented by (I', Q') in accordance with a predetermined rule to obtain the diffused symbols S represented by (I, Q).

For example, if N--1 symbols form a diffusion unit block and if a number G smaller than N is selected such that G and N are prime to each other, diffusion is executed as replacement of a vector formed of symbols before diffusion:

(S'1, S'2, . . . , S'k, . . . , S'N-1) with a vector formed of symbols after diffusion:

(S1, S2, . . . , Sn, . . . , SN-1), where Sn=S'k (n=G^k mod N). In this expression, G^k means G to the kth power. Diffusion circuit 7 outputs the I and Q components of the symbols after symbol diffusion. A modulator 8 modulates a carrier wave with the I and Q components of symbols S on the basis of the orthogonal frequency division multiplex (OFDM) method and transmits the modulated wave through an antenna 9.

FIG. 13 shows the configuration of a receiver for receiving data from the transmitter shown in FIG. 9. A demodulator 32 demodulates an electric wave received through an antenna 31 and outputs a series of signals, corresponding to the series of symbols supplied to the modulator 8 of the transmitter. Each such signal includes an I component and a Q component corresponding to the I and Q components of the transmitted symbols. It should be appreciated that the I and Q components of the signals output by demodulator are not perfect duplicates of the I and Q values supplied to modulator of the transmitter. Noise and other imperfections in the transmission path cause variations in the received I and Q values. The I and Q values constituting the received signals are handled in the receiver as real values, i.e., either as analog values or, preferably, as multi-bit digital values. Demodulator 32 supplies the received signals as series of I and Q components.

A symbol diffusion reversal circuit 33 processes the received signals in a manner inverse to the symbol diffusion processing in the symbol diffusion circuit 7 of the transmitter (FIG. 9). Thus, the diffusion reversal circuit restores the received signals to the original order of the symbols before the order was changed in the symbol diffusion circuit 7. This diffusion reversal operation, if expressed by using the same N and G as those used with respect to the symbol diffusion circuit 7, is replacement of a vector formed of signals before diffusion reversal processing:

(S1, S2, . . . , Sn, . . . , SN-1) with a vector formed of signals after diffusion reversal processing:

(S'1, S'2, . . . , S'k, . . . , S'N-1), where Sn=S'k (n=G^k mod N).

I component values I' and Q component values Q' output from the symbol diffusion reversal circuit 33 are supplied to bit diffusion reversal circuits 34-1 and 34-2, respectively. The bit diffusion reversal circuits process the I' and Q' components output in a manner inverse to the bit diffusion applied by the bit diffusion circuits 5-1 and 5-2 of the transmitter. Thus, bit diffusion reversal circuit 34-1 processes items of data (I component values) in blocks of M items. A vector formed of a sequence of output M items after diffusion reversal processing:

(B0, B1, . . . , Bk, . . . , BM-1) is obtained from a vector formed of a sequence of input M items:

(B'0, B'1, . . . , B'n, . . . , B'M-1), where B'n=Bk (n=k+s mod M).

The value s used in bit diffusion reversal processing in the bit diffusion reversal circuit 34-1 is the same as the value s used in the bit diffusion circuit 5-1 of the transmitter. Bit diffusion reversal circuit 34-2 operates in the same manner, but uses a value s equal to the value s used by the other bit diffusion reversal circuit 5-2.

The two data sequences (x, y) output from the bit diffusion reversal circuits 34-1 and 34-2 are input to a parallel-serial converter 35 to be converted into one data sequence to be supplied to a bit insertion circuit 36. The parallel-serial converter 35 performs the operation reverse to that of the serial-parallel converter 4 to convert the two data sequences (x, y) into one data sequence.

The bit insertion circuit 36 splits the serial data stream into two parallel data streams and performs bit insertion processing inverse to the bit erase processing in the bit erase circuit 3 shown in FIG. 9. The bit insertion circuit 36 uses the same map used by the bit erase circuit of the transmitter:

X: 10

Y: 11

Thus, when data is input in the order of x1, y1, y2 to insertion circuit 36, an arbitrary dummy data item (here assumed to be 0) is inserted at the position corresponding to the erased data item and X1 (=x1), 0 are output as X data, and Y1 (=y1), Y2 (=y2) are output as Y data in this order.

The output data sequences X and Y are supplied to a Viterbi decoder 37. Also, an insertion flag indicating the position at which the dummy data is inserted is supplied to the Viterbi decoder 37. At this stage of processing, the individual data elements of sequences X and Y (other than the dummy values) are still real numbers corresponding to the values of the I and Q components in the received signals, rather than single-bit 1 or 0 elements. The real numbers in these data sequences correspond to the 1 and 0 values of the mother codes output by the convolutional encoder 2 of the transmitter. If the transmission channel were a perfect channel, each number corresponding to a 0 in the mother code would have exactly the same value, equal to the nominal value $1/\sqrt{2}$ assigned by the signal point assignment circuit of the transmitter, whereas each number corresponding to a 1 in the mother code would have the other nominal value $-1/\sqrt{2}$. However, noise and other imperfections in the transmission path between the transmitter and receiver will cause these values to vary somewhat from the nominal values.

The Viterbi decoder 37 decodes the data sequences X and Y to recover the reproduced information corresponding to the original message. Thus, the decoder performs Viterbi decoding according to the state transitions (FIG. 11) of the convolutional encoder 2.

FIG. 14 shows an example of the Viterbi decoder 37. Data X and Y output from the bit insertion circuit 36 are supplied to input terminals 62-1 and 62-2 respectively for input to branch metric calculation circuits 63-1 to 63-4. Each of the branch metric calculation circuits 63-1 to 63-4 calculates, as a branch metric, the distance between the input data (X, Y) and an associated one of the coordinate points defined by nominal values shown in FIG. 12.

Outputs (branch metrics) BM00 and BM11 from the branch metric calculation circuits 63-1 and 63-4 are input to add compare select (ACS) circuits 64-1 and 64-3. Also, an output (branch metric) BM01 from the branch metric calculation circuit 63-2 and an output (branch metric) BM10 from the branch metric calculation circuit 63-3 are input to ACS circuits 64-2 and 64-4.

Four state metric storage units 66-1 through 66-4 are provided. State metric storage unit 66-1 has an input 66-1a connected to an output of ACS unit 64-1. In like manner, each of the other state metric storage units 66-2, 66-3 and 66-4 has an input connected to the outputs of ACS units 64-2, 64-3 and 64-4, respectively.

An output (state metric) SM00 from state metric storage 66-1 and an output (state metric) SM01 from state metric storage 66-2 are also input to the ACS circuits 64-1 and 64-3. An output (state metric) SM10 from state metric storage 66-3 and an output (state metric) SM11 from state metric storage 66-4 are also input to the ACS circuits 64-2 and 64-4.

Each of the ACS circuits 64-1 to 64-4 calculates the sum of one of the input branch metrics BM and the corresponding state metric SM and calculates the sum of the other input branch metric BM and the corresponding state metric SM. Each of the ACS circuits 64-1 to 64-4 compares the two sums with each other to select the smaller one of them, outputs the smaller sum as a new state metric SM to the corresponding one of the state metric storage units 66-1 to 66-4, and outputs signals SEL00 to SEL11 representing the selection result to a path memory 65. State metrics SM00 to SM11 from the state metric storages 66-1 to 66-4 are also input to the path memory 65.

Each of the state metric storages 66-1 to 66-4 can be reset by a signal which is input via a terminal 61. The path memory 65 outputs the result of decoding through a terminal 67.

The operation of the Viterbi decoder 37 will be described in more detail. Branch metric calculation circuit 63-1 calculates the distance between the input data (X, Y) and the coordinate point ($1/\sqrt{2}$, $1/\sqrt{2}$) as branch metric BM00. Similarly, Branch metric calculation circuit 63-2 calculates the distance between the input data (X, Y) and the coordinate point ($1/\sqrt{2}$, $-1/\sqrt{2}$) as branch metric BM01. Branch metric calculation circuit 63-3 calculates the distance between the input data (X, Y) and the coordinate point ($-1/\sqrt{2}$, $1/\sqrt{2}$) as branch metric BM10. Branch metric calculation circuit 63-4 calculates the distance between the input data (X, Y) and the coordinate point ($-1/\sqrt{2}$, $-1/\sqrt{2}$) as branch metric BM11. In computing the branch metrics, distance calculation with respect to the inserted dummy data is omitted in response to the insertion flag supplied from the bit insertion circuit 36. That is, the distance between each inserted dummy data value and the related coordinate point is set to a zero value as further discussed below with reference to FIG. 15.

ACS circuit 64-1 performs two calculations shown below corresponding to the state transitions of the convolutional encoder 2, and selects one of the results of these calculations with a higher likelihood, i.e., the smaller one of the calculation results. Information SEL00 on this selection is supplied to the path memory 65 while the calculation result is SM00 is supplied to the state metric storage 66-1.

$$SM00+BM00 \tag{1}$$

$$SM01+BM11 \tag{2}$$

SM00 is the value of the state metric storage 66-1 remaining from the preceding clock cycle, i.e., the value of the state metric resulting from processing the preceding X and Y values in the data sequence. Similarly, SM01 is the value remaining in state metric storage 66-2 from the preceding clock cycle. BM00 is the result of calculation of the branch metric calculation circuit 63-1, and BM11 is the result of calculation of the branch metric calculation circuit 63-4.

If the result of calculation (1) is smaller, SEL00=0 is supplied to the path memory 65. If the result of calculation (2) is smaller, SEL00=1 is supplied to the path memory 65. In the former case, SM00+BM00 is stored as new state metric SM00 in the state metric storage 66-1. In the latter case, SM01+BM11 is stored as new state metric SM00 in the state metric storage 66-1.

This calculation will be described with reference to the state transition diagram of FIG. 11. The branch metrics can be understood as representing the likelihood that the input data (X, Y) represents the mother code bits produced by a transition of the convolutional encoder which resulted in particular outputs. For example, if input data X, Y having values very close to the nominal values $(1/\sqrt{2}, 1/\sqrt{2})$ is received, and hence the magnitude of BM00 is small, then it is likely that the input data was produced by a transition of the convolutional encoder 2 at the transmitter which produced outputs (mother code bits X, Y) of 00. The state metrics can be understood as representing the probability that the convolutional encoder 2 at the transmitter which produced the data was in a particular state, with smaller values of the state metrics representing greater probability. For example, a smaller value of SM00 indicates a high probability that the encoder was in state 00. There are two paths to the state 00. The first path is defined by input of 0 in the state 00 and by output of 00. A corresponding comparative calculation is represented by expression (1). The second path is defined by input of 0 in the state 01 and by output of 11. A corresponding comparative calculation is represented by expression (2). The smaller one of the two calculation results is supplied as new state metric SM00 to the state metric storage 66-1.

Each of the ACS circuits 64-2 to 64-4 also performs the same operation. Each of the state metric storages 66-1 to 66-4 is reset to 0 in an initial stage of the operation of the system. Control of this resetting is performed by a controller (not shown) via the terminal 61.

Path memory 65 generates the reproduced data which is the final output of the receiver, in accordance with the state transitions shown in FIG. 11. The path memory uses selection information SEL00 to SEL11 supplied from the ACS circuits 64-1 to 64-4 and the state metrics SM00 to SM11 supplied by state metric storage units 66-1 to 66-4.

FIG. 15 shows a branch metric calculation circuit 63-1 in detail. Data X input through the terminal 62-1 is input to a subtracter circuit 51, which subtracts $1/\sqrt{2}$ supplied from a generator circuit 52 from data X. The difference output from the subtracter circuit 51 is supplied to two input terminals of a multiplier circuit 53 and multiplied by itself (i.e., squared). A selector 203 is supplied with an output from the multiplier circuit 53 and with a 0 output from a generator circuit 202. When the flag indicating insertion in X is input to the selector 203 from bit insertion circuit 36 (FIG. 13) via a terminal 201, the selector 203 selects the 0 generated by the generator circuit 202. When no flag indicating insertion in X is input, the selector 203 selects the output from the multiplier circuit 53. The selector 203 outputs the selected value to an adder circuit 54.

Data Y input via the terminal 62-2 is input to a subtracter circuit 55, which subtracts $1/\sqrt{2}$ supplied from a generator circuit 56 from data Y. The output from subtracter circuit 56 is supplied to two input terminals of a multiplier circuit 57 to be multiplied by itself (i.e., squared). A selector 206 is supplied with an output from the multiplier circuit 57 and with an output from a 0 generator circuit 205. When the flag indicating insertion in Y is input to the selector 206 via a terminal 204, the selector 206 selects 0 from circuit 205. When no flag indicating insertion in Y is input, the selector 206 selects the output from the multiplier circuit 57. The selector outputs the selected value to adder circuit 54. The adder circuit 54 calculates the sum of the outputs from the selectors 203 and 206 and outputs the sum as branch metric BM00.

Thus, when no insertion flag is supplied, the operation of this branch metric calculation circuit is as described below. The subtracter circuit 51 outputs $X-1/\sqrt{2}$, and the multiplier circuit 53 squares this value to output $(X-1/\sqrt{2})^2$. Also, the subtracter circuit 55 outputs $Y-1/\sqrt{2}$, and the multiplier circuit 57 squares this value to output $(Y-1/\sqrt{2})^2$. The adder circuit 54 calculates the sum of the outputs from the multiplier circuits 53 and 57, i.e., $(X-1/\sqrt{2})^2+(Y-1/\sqrt{2})^2$ and outputs this value as branch metric BM00.

On the other hand, when the flag indicating insertion in X is input, the selector 203 outputs 0, so that the output from the adder circuit 54 is $(Y-1/\sqrt{2})^2$. When the flag indicating insertion in Y is input, the selector 206 outputs 0 and the output from the adder circuit 54 is $(X-1/\sqrt{2})^2$.

Each of the branch metric calculation circuits 63-2 to 63-4 have the same circuit configuration as that shown in FIG. 15 and performs the same operation. In the branch metric calculation circuit 63-2, however, the output of the generator circuit 52 is $1/\sqrt{2}$ and the output of the generator circuit 56 is $-1/\sqrt{2}$. In the branch metric calculation circuit 63-3, the outputs of the generator circuits 52 and 56 are $-1/\sqrt{2}$ and $1/\sqrt{2}$, respectively. In the branch metric calculation circuit 63-4, the output of each of the generator circuits 52 and 56 is $-1/\sqrt{2}$.

FIG. 16 is a block diagram of the path memory 65. Selection information items SEL00 to SEL11 output from the ACS circuits 64-1 to 64-4 are supplied to terminals 71-1 to 71-4. The selection information items SEL00 to SEL11 are input as control signals to two-input one-output selectors 73-1 to 73-4, respectively. A fixed data item 0 is supplied from a terminal 72-1 as two inputs to the selector 73-1, whereas fixed data item 0 is supplied from terminal 72-2 as the two inputs of selector 73-2. Similarly, a fixed data item 1 is supplied from terminals 72-3 and 72-4 as two inputs to each selector 73-2 to 73-4.

Each of the selectors 73-1 to 73-4 selects one of the two inputs according to the corresponding one of the selection information items SEL00 to SEL11 and outputs the selected data item to the corresponding one of registers 81-1 to 81-4. As mentioned above the same data item from one of the terminals 72-1 to 72-4 is input as two inputs to the corresponding one of the first-column selectors 73-1 to 73-4. Therefore, the first-column registers 81-1 to 81-4 store 0, 0, 1, and 1, respectively.

Other selectors and registers are arranged in the same manner as those described above; the selectors and registers are arranged in n columns (four columns in the example shown in FIG. 16). That is, in the second column, selectors 74-1 to 74-4 and registers 82-1 to 82-4 are provided. Outputs from first-column registers 81-1 and 81-2 are supplied to the selectors 74-1 and 74-3 in the second column. Outputs from first-column registers 81-3 and 81-4 are supplied to second-column selectors 74-2 and 74-4. Each of the second-column selectors 74-1 to 74-4 performs processing such as to select one of the two inputs according to the value of the corresponding one of the selection information items SEL00 to SEL11 and to output the selected data item to the corresponding one of the second-column registers 82-1 to 82-4. For example, register 74-1 selects the output of register 81-1 when selection information item SEL00 is 0, selects the output of register 81-2 when selection information item SEL00 is 1, and outputs the selected data item to register 82-1. The third and fourth column selectors and registers operate in a similar manner.

Outputs from registers 84-1 to 84-4 in the final column are input to a four-input one-output selector 85. State metrics SM00 to SM11 output from the state metric storages 66-1 to 66-4 shown in FIG. 14 are input to a minimum value comparator circuit 88. The minimum value comparator circuit 88 compares the four state metrics and selects the smallest of them. The minimum value comparator circuit 88 outputs data 00 if the state metric SM00 is the smallest, data 01 if the state metric SM01 is the smallest, data 10 if the state metric SM10 is the smallest, and data 11 if the state metric SM11 is the smallest. The selector 85 selects the output of the register 84-1 when the input from the minimum value comparator circuit 88 is 00, the output of the register 84-2 when the input from the minimum value comparator circuit 88 is 01, the output of the register 84-3 when the input from the minimum value comparator circuit 88 is 10, and the output of the register 84-4 when the input from the minimum value comparator circuit 88 is 11. The output from the selected register is output by selector 85 as a decoding result through a terminal 86. The sequence of outputs from terminal 86 represents the reproduced information.

The above-described connections in the path memory 65 provide outputs corresponding to the state diagram of FIG. 11. The fixed values (0 and 1) at terminals 72-1 to 72-4 represent possible decoded information items. The values which will propagate through the matrix of selectors and registers will depend on the values of selection information SEL00 through SEL11. Those values in turn depend on the values of the state metrics and branch metrics during each clock cycle as discussed above. In effect, the data items which appear at the final registers 84-1 through 84-4 are associated with different possible paths through the trellis or sequence of states of the convolutional encoder. The data item corresponding to the path with the maximum likelihood is selected from the four data items stored in registers 84-1 through 84-4 of the final column, and the selected item is output as the reproduced information. The selector 85 selects the item corresponding to the state metric minimum value, i.e., the path with the maximum likelihood, at each time point. Stated another way, the Viterbi decoder yields a sequence of reproduced data which represents the most likely sequence of original data input to the convolutional encoder at the transmitter. In choosing the most likely sequence, the decoder selects each bit of the reproduced data on the basis of several bits of transmitted data. This provides substantial coding gain.

The increasing demand for high speed data transmission makes it desirable to extend the digital data transmission system described above from the QPSK implementation to other, more complex modulation systems. In the more complex transmission schemes, each transmitted signal denotes values for more than two bits. Each signal typically includes two components, each component having more than two possible nominal values. Examples of such modulation systems include 16-QAM, 64-QAM, and 256-QAM. In the 16-QAM system, each symbol includes two components, and each component has four possible nominal values, so that any one of 16 possible symbols can be transmitted. Thus, each symbol can denote values for four bits. The 64-QAM and 256-QAM systems use symbol sets with 64 and 256 possible symbols to encode six and eight bits per symbol, respectively. By comparison, in the QPSK system described above, only two bits are encoded in each symbol. The more complex transmission systems offer the possibility of higher data transmission rates. However, it is difficult to use an encoding and decoding strategy with convolutional or punctured convolutional coding and with bit diffusion as described above in combination with a multi-component, multi-value modulation system.

FIG. 17 depicts a data transmitter using 16-QAM. In FIG. 17, sections corresponding to the QPSK transmitter of FIG. 9 are indicated by the same reference numerals. The convolutional encoder 2 and bit erase circuit 3 are identical to those used in the QPSK transmitter, and produce a punctured convolutional code sequences identical to that discussed above. However, the serial-parallel converter 4 of FIG. 17 splits the serial data output from bit erase circuit 3 into four parallel data streams u, v, x, and y. These data items in each undergo bit diffusion processing in bit diffusion circuits 91-1 to 91-4 to yield reordered data u', v', x', and y', which are supplied to a signal point assignment circuit 6. The bit diffusion processing applied to each data sequence is the same as that applied in the bit diffusion circuits 5-1 and 5-2 of FIG. 9. The bit diffusion processing is varied with respect to the data sequences by using different values s for each data sequence.

The signal point assignment circuit 6 assigns input 4-bit data (u', v', x', y') as symbols of the 16-QAM symbol set shown in FIG. 18. In the 16-QAM set, each symbol includes two components I' and Q'. Each component can have any one of four nominal values, and each component denotes values of two bits. Thus, component I' denotes the values of the first and third bits of the 4-bit data, whereas component Q' denotes the values of the second and fourth bits. For example, (I', Q')=(3/$\sqrt{10}$, 3/$\sqrt{10}$) when (u', v', x', y')=(0, 0, 0, 0), and
(I', Q')=(3/$\sqrt{10}$, 3/$\sqrt{10}$) when (u', v', x', y')=(0, 0, 0, 1)

The symbols produced by signal point assignment circuit 6 are subjected to symbol diffusion in a symbol diffusion circuit 7 in the same manner as discussed above, and the reordered components I and Q are supplied to a modulator 9 and transmitted by OFDM modulation as discussed above. In other respects, the configuration of the transmitter shown in FIG. 17 is the same as that shown in FIG. 9.

A receiver for the 16-QAM signal from the transmitter of FIG. 17, constructed in a manner analogous to the QPSK receiver of FIG. 13, would have the structure shown in FIG. 19. However, a receiver as shown in FIG. 19 will not operate properly.

In the QPSK system as described above with reference to FIG. 13, each of the signal components I and Q input from the symbol diffusion reversal circuit 33 to the bit diffusion reversal circuits 34-1 and 34-2 represents one bit of the bit-diffused punctured convolutional code message. Therefore, reordering of the I and Q signal components by the bit diffusion reversal circuits, in a manner inverse to the reordering applied by the bit diffusion circuits of the transmitter, will restore the signal components to the same order as the order of the bits in the message before bit diffusion processing. However each of components I and Q in the 16-QAM system represents two bits. In the symbol set or signal point constellation shown in FIG. 18, I includes information of the first and third bits while Q includes information of the second and fourth bits. However, I is one value such as 1/$\sqrt{10}$ or 3/$\sqrt{10}$, and Q is also such one value. If the stream of I and Q component values is simply divided into four data streams as shown in FIG. 19, each data item in each data stream u', v', x' and y'still represents two bits, rather than a single bit. Applying diffusion reversal processing in circuits 95-1 to 95-4, inverse to the bit diffusion processing applied to single-bit data items by transmitter bit diffusion circuits 91-1 to 91-4 (FIG. 17) will scramble the data; it will not recover the original order. Stated another way, the bit diffusion operation is performed at the transmitter on single-bit data, but the signal component values I and Q represent two bits each. Therefore, the inverse operation cannot be performed on the I and Q component values at the receiver.

The same problem arises in connection with the bit erase and bit insertion operations. Thus, the bit erase circuit 3 of the transmitter in FIG. 17 operates on single bits of the mother code. Operation of the bit insertion circuit 36 to insert dummy data into a stream of two-bit component value, will further scramble the data and will not restore the original structure of the data. For example, if a sequence of data items such as x1, y1, x2, y2, x3, y3, . . . shown in FIG. 20(A) are input to the bit insertion circuit 36 operating according to the bit erase map discussed above and used in the bit erase circuit of FIG. 13, then x1 and y1 are output as data items X1 and Y1, a dummy data item d is next output as a data item X2, and x2 is thereafter output as a data item Y2, as shown in FIG. 20(B). Similarly, y2 and x3 are output as data items X3 and Y3, a dummy data item d is output as a data item X4, and y3 is output as a data item Y4.

However, this processing is not equal to the processing reverse to the processing in the bit erase circuit 3 shown in FIG. 17. Again, the bit erase circuit operates on bit-level data, to erase individual data bits. By contrast, each of data items x1, y2 and so on shown in FIG. 20(B) corresponds to two bits of data. The output data sequence obtained by inserting one bit of dummy data d in a sequence of two bit data items is utterly different from the original data sequence. The result of Viterbi decoding of the output from the bit insertion circuit 36 by the Viterbi decoder 37 would be completely different from the original data.

It would appear that the problems associated with handling component values representing multiple bits could be obviated by recovering the individual bit values at or immediately after the symbol diffusion reversal circuit 33 of the data receiver shown in FIG. 19. Thus, prior to the bit diffusion reversal circuit, the I and Q components of each signal can be evaluated to yield the individual bit values u', v', x' and y'. In such a case, the distances between the coordinates (I, Q) defined by the I and Q components of each received signal and the nominal signal points shown in FIG. 18 are calculated. The received signal is deemed to represent the symbol associated with the closest nominal signal point, and bit values are assigned on the basis of that symbol. For example, a received signal having I and Q coordinates close to coordinates $(-1/\sqrt{10}, 3/\sqrt{10})$ is deemed to represent the symbol having nominal values $(-1/\sqrt{10}, 3/\sqrt{10})$, i.e., 1010 in FIG. 18. The bit values associated with this symbol are assigned to the 4-bit data; u'=1, v'=0, x'=1 and y'=0. The bit values recovered in this manner are single-bit values and can be processed through bit diffusion reversal and bit insertion.

However, such a system makes a "hard" decision as to the value of each bit based on the content of a single received signal. It sacrifices the advantages of noise immunity and coding gain obtained by "soft" decoding, such as the Viterbi decoding discussed above, in which information transmitted in several signals, during several unit times, contributes to the decision made by the receiver as to the most probable value for each bit of the reproduced information.

Similar problems arise in other multi-value, multi-component modulation systems such 64-QAM or 256-QAM. Thus there has been a need for improved receiving apparatus and methods which can accurately receive and decode data transmitted by a multi-value, multi-component modulation system can be accurately decoded.

SUMMARY OF THE INVENTION

One aspect of the present invention provides a data receiver for receiving a series of signals in which each received signal includes a plurality of components and in which each received signal denotes values for more than two bits of data in a message encoded according to a punctured convolutional code. For example, the receive signals may be signals such as 16-QAM, 64-QAM or 256-QAM signals or other multi-component, multi-value signals having plural components, such as the I and Q components of a multi-phase signal in which each component denotes values for two or more data bits. The receiver according to this aspect of the present invention includes bit metric calculation means for calculating at least one bit metric for each of the bits of data denoted by each signal so as to provide one or more sequences of bit metrics and also includes bit insertion means for performing bit insertion processing in the sequences of bit metrics in accordance with a predetermined rule to thereby form one or more augmented sequences of bit metrics.

The bit insertion means desirably operates according to a rule inverse to the rule used by a bit erase circuit at the transmitter so that the one or more augmented sequences of bit metrics substantially correspond to the sequences of bit values constituting the mother convolutional code supplied to the bit erase circuit at the transmitter. For example, the bit insertion means may be arranged to insert dummy data into the sequences of bit metrics at positions corresponding to the positions of erased bits so that the augmented sequences of bit metrics are identical to the mother convolutional code sequences supplied to the bit erase means of the transmitter except that the dummy data replaces the erased bits.

Preferably, the receiver according to this aspect of the invention further includes decoding means for decoding the data by processing the one or more augmented sequences of bit metrics by a deconvolution scheme, preferably a most-likelihood decoding scheme such as a Viterbi decoding scheme.

This aspect of the invention incorporates the realization that because each bit metric represents a single bit of the transmitted data, the bit metrics can be handled and subjected to the bit insertion process inverse to bit erasing processes applied to single bit data at the transmitter. However, the bit metrics are not "hard" 1 or 0 values for individual bits. Rather, each bit metric most preferably represents the probability that the value of the bit in the transmitted symbol corresponding to the received signal had a particular value. The bit metrics are real numeric values, similar to the real values of the individual signal components propagated through the various stages of the QPSK receiver and presented to the Viterbi decoder as discussed above with reference to FIG. 13. These real values can be used in a "soft" decoding scheme such as Viterbi decoding in which the receiver decides on the most probable value of each bit in the reproduced information based on information contained in several bits sent through the transmission channel. Thus, apparatus according to this aspect of the invention allows data encoded in a punctured convolutional code used as an error correcting code to be transmitted by a multi-component, multi-value system and accurately decoded at the receiver.

As further discussed below, several different approaches can be used to determine the bit metrics. The bit metrics can be supplied individually, one bit metric per bit denoted by the received signal or else can be calculated in pairs including a first bit metric and a second bit metric for each bit of the received signal. In this latter approach, the first bit metric desirably represents the probability that the bit has a first value, whereas the second bit metric for the same bit represents the probability that the bit has a second, opposite value.

The receiver according to this aspect of the present invention may further include symbol diffusion reversal means for performing symbol diffusion processing. In one arrangement, the symbol diffusion reversal means provides an altered series of received signals to the bit metric calculation means. Thus, the symbol diffusion reversal means may include means for interchanging components of certain received signals in an incoming sequence of received signals with components of other received signals in the incoming sequence according to a predetermined pattern so as to provide the altered sequence of received signals.

According to a further aspect of the invention, the symbol diffusion reversal means may be arranged to operate on the sequences of bit metrics supplied by the bit metric calculation means. Thus, the symbol diffusion reversal means may be arranged to interchange bit metrics derived from certain received signals with bit metrics derived from other received signals according to a predetermined pattern and thus modify the sequence of bit metrics supplied by the bit metric calculation means. Preferably, such modification occurs before the one or more sequences of bit metrics are supplied to the bit insertion means.

Further aspects of the present invention include methods of receiving a series of signals as discussed above in connection with the apparatus. Methods according to this aspect of the invention desirably include the steps of calculating at least one bit metric for each of the bits of data denoted by each received signal so as to provide one or more sequences of bit metrics and performing bit insertion processing in the sequences of bit metrics in accordance with a predetermined rule to thereby form one or more augmented sequences of bit metrics. Methods according to this aspect of the invention provide advantages similar to those discussed above in connection with the apparatus. Methods according to this aspect of the invention desirably further include the steps of decoding the data by processing the sequences of bit metrics, as by deconvoluting according to a Viterbi decoding scheme or other most-likelihood decoding scheme. The methods according to this aspect of the invention also desirably include the step of performing symbol diffusion reversal processing, either by rearranging components of received signals in an incoming sequence of signals before bit metric calculation or by interchanging bit metrics derived from received signals with bit metrics derived from other received signals after calculation of the bit metrics.

These and other objects, features and advantages of the present invention will be more readily apparent from the detailed description of the preferred embodiments set forth below, taken in conjunction with the accompanying drawings.

BRIEF DESCRIPTION OF THE DRAWINGS

FIG. 20 is a diagram for explaining the operation of the receiver shown in FIG. 19.

DETAILED DESCRIPTION OF THE PREFERRED EMBODIMENTS

Figure 1:
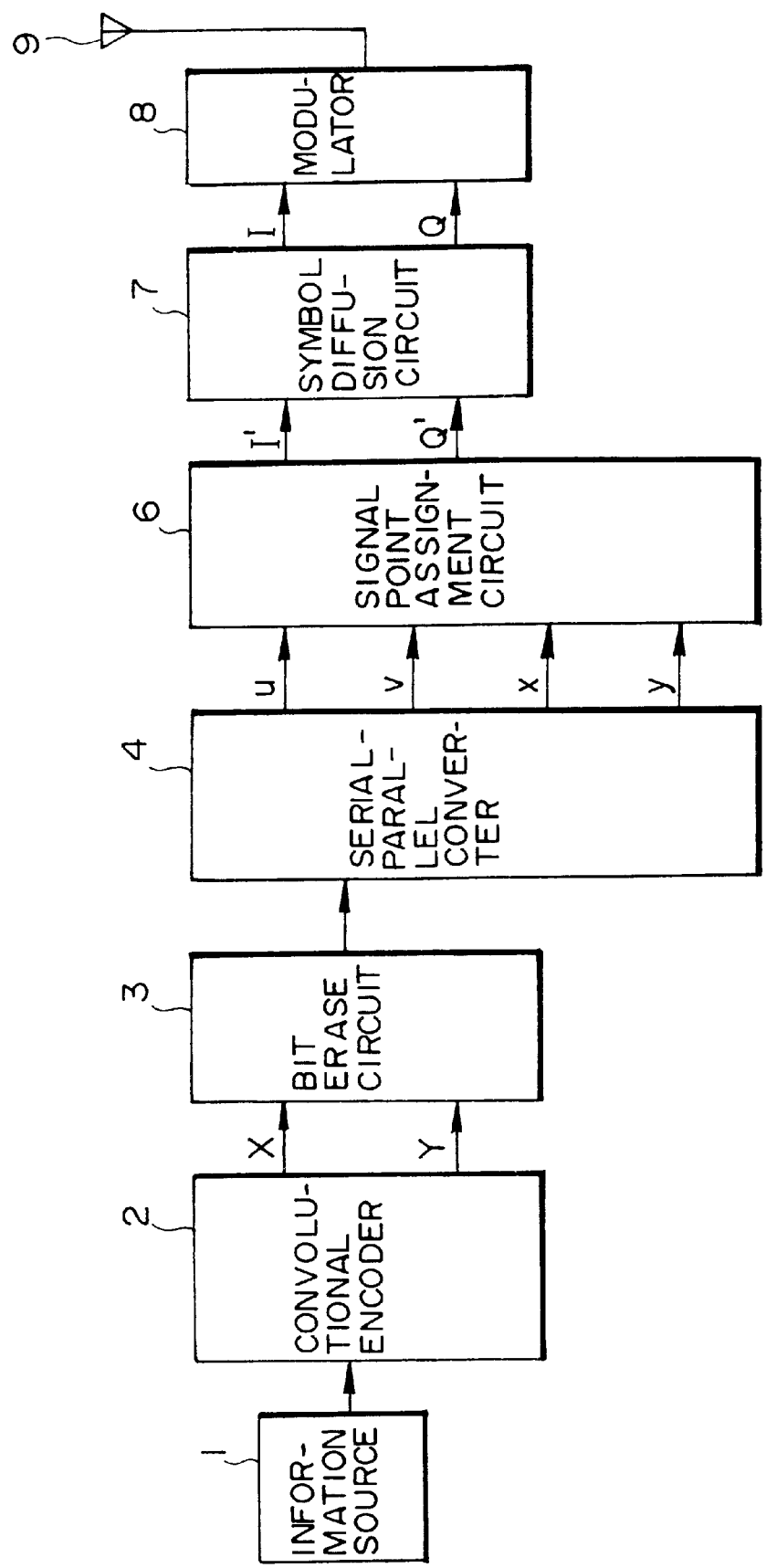
FIG. 1 is a block diagram showing the configuration of a data transmitter.
Figure 17:
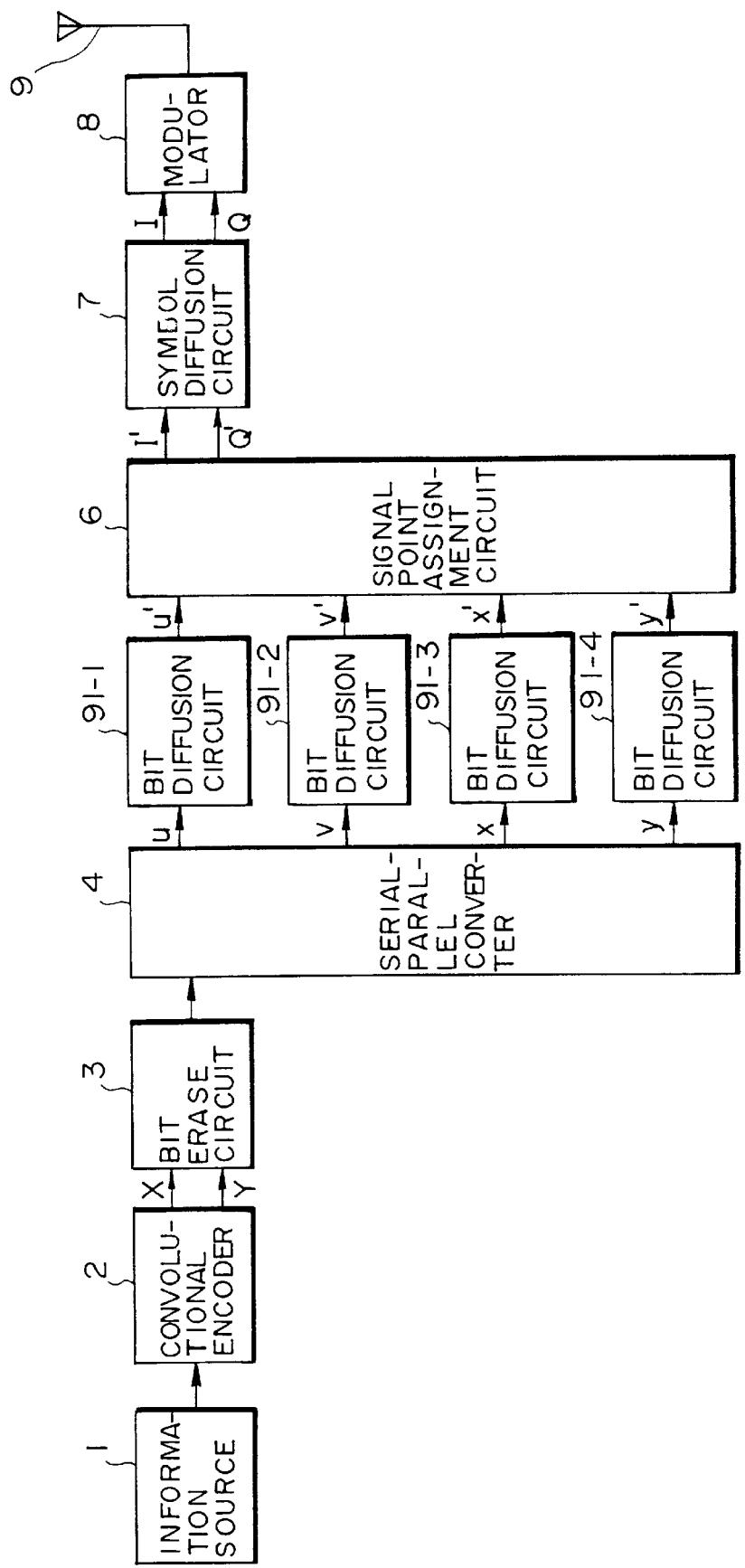
FIG. 17 is a block diagram showing the configuration of an example of a data transmitter using 16-QAM.

Although A data transmitter shown in FIG. 1 is generally similar to the transmitter of FIG. 17, but omits the bit diffusion circuits of FIG. 1. data can be transmitted without bit diffusion. In FIG. 1, sections corresponding to those shown in FIG. 17 are indicated by the same reference numerals. Thus, the description of such sections will not be repeated.

In the transmitter of FIG. 1, data u, v, x, and y output from the serial-parallel converter 4 are supplied directly to the signal point assignment circuit 6 without undergoing bit diffusion. In all other respects, the operation is the same as that described above.

Figure 2:
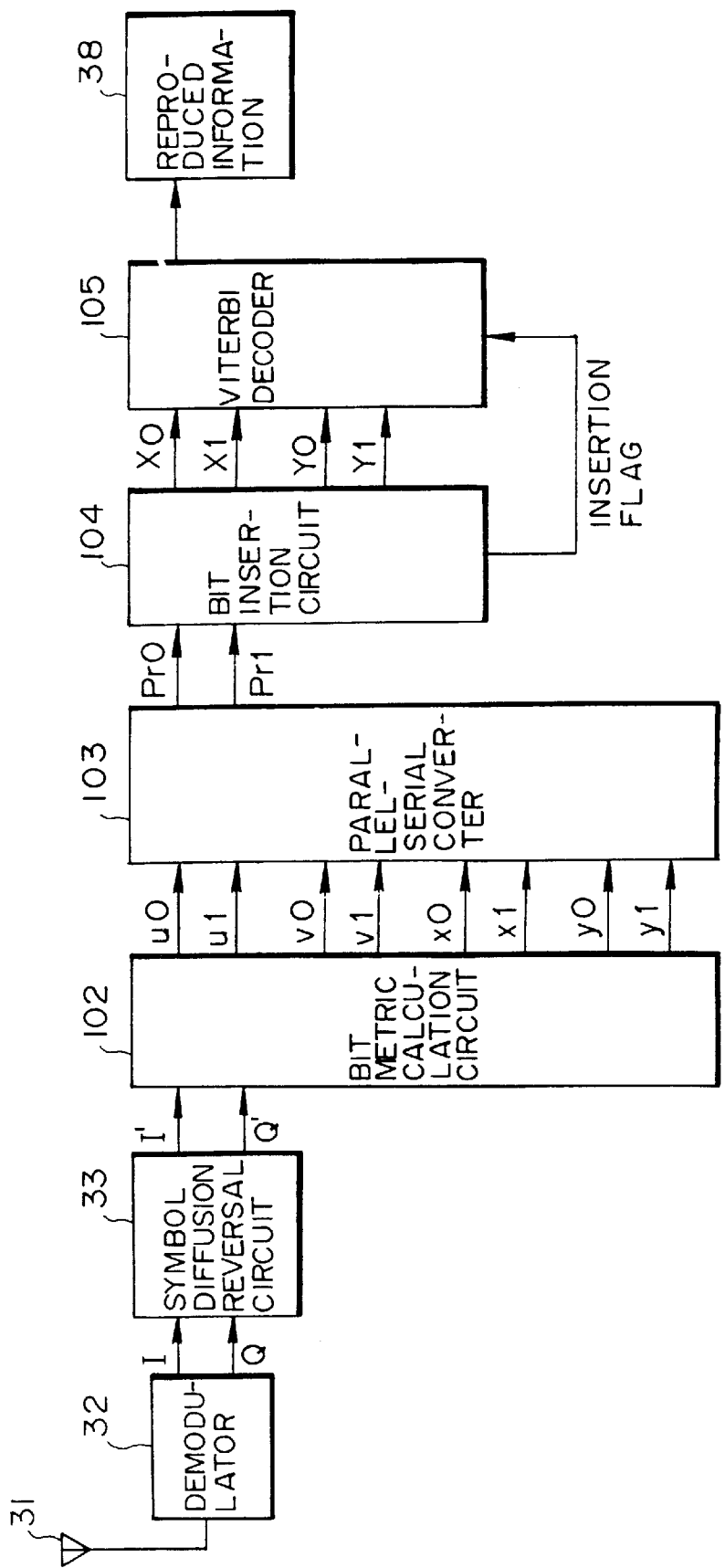
FIG. 2 is a block diagram showing the configuration of a data receiver which represents a first embodiment of the present invention.
Figure 13:
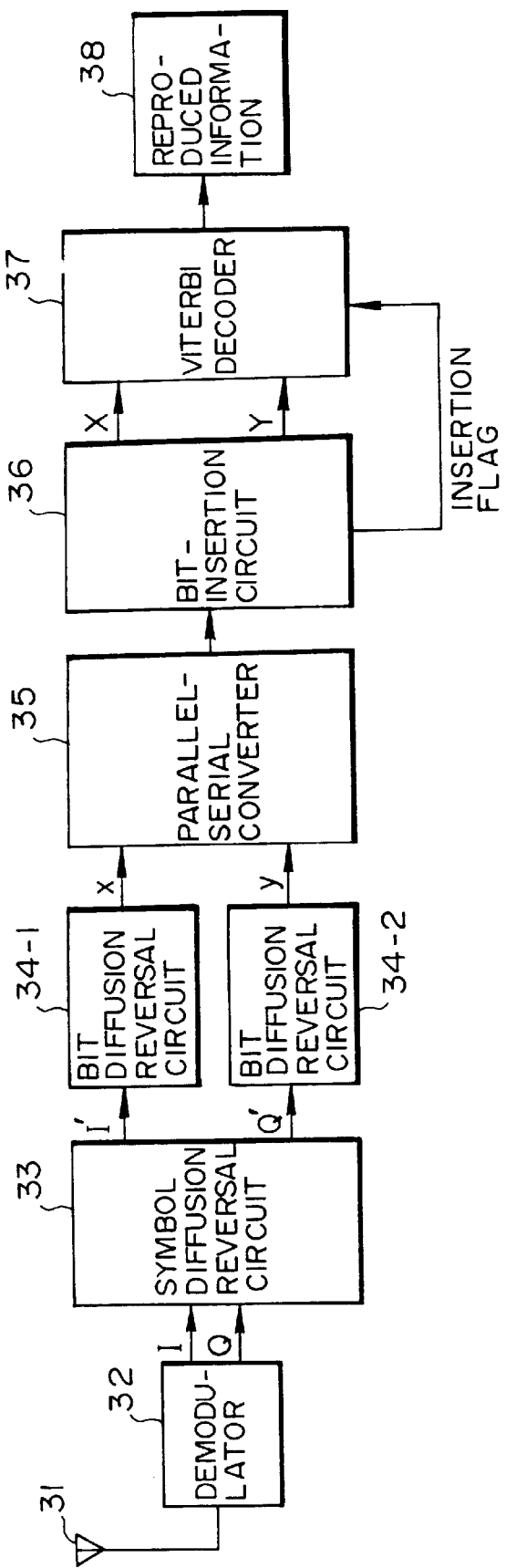
FIG. 13 is a block diagram showing the configuration of a conventional data receiver.

FIG. 2 shows a receiver in accordance with one embodiment of the invention. This receiver is arranged to receive data transmitted by the transmitter shown in FIG. 1. In FIG. 2, sections corresponding to those of the conventional data receiver shown in FIG. 13 are indicated by the same reference numerals. Those features not discussed below are the same as the corresponding features of the receiver shown in FIG. 13. The receiver includes an antenna 31 and demodulator 32 for recovering multi-component signals having I and Q components from a transmission path, and passing the I and Q component values to a symbol diffusion reversal circuit 33. The symbol diffusion reversal circuit is arranged to perform processing inverse to that in the symbol diffusion circuit 7 of the transmitter (FIG. 17). As discussed above, this reversal process interchanges components of certain symbols with components of other symbols, thereby restoring the received signals to the order which the symbols had before processing in symbol diffusion circuit 7. The symbol diffusion reversal circuit outputs the reordered I and Q signal components I' and Q' to a bit metric calculation circuit.

Four sequences of bit metric pairs (u0, u1), (v0, v1), (x0, x1), and (y0, y1) are output from the metric calculation circuit 102 and are input to a parallel-serial converter 103. The parallel-serial converter 103 converts the four separate sequences into one sequence of bit metric pairs (Pr0, Pr1). A bit insertion circuit 104 inserts bits into the sequence output from the parallel-serial converter 103 in a manner opposite to that of the bit erase circuit 3 of the transmitter shown in FIG. 1. The bit erase circuit also forms the sequence of bit metric pairs into two separate sequences of bit metric pairs (X0, X1) and Y0, Y1). These sequences are. input into a Viterbi decoder 105. The data decoded by Viterbi decoding is output as reproduced information 38.

Figure 3:
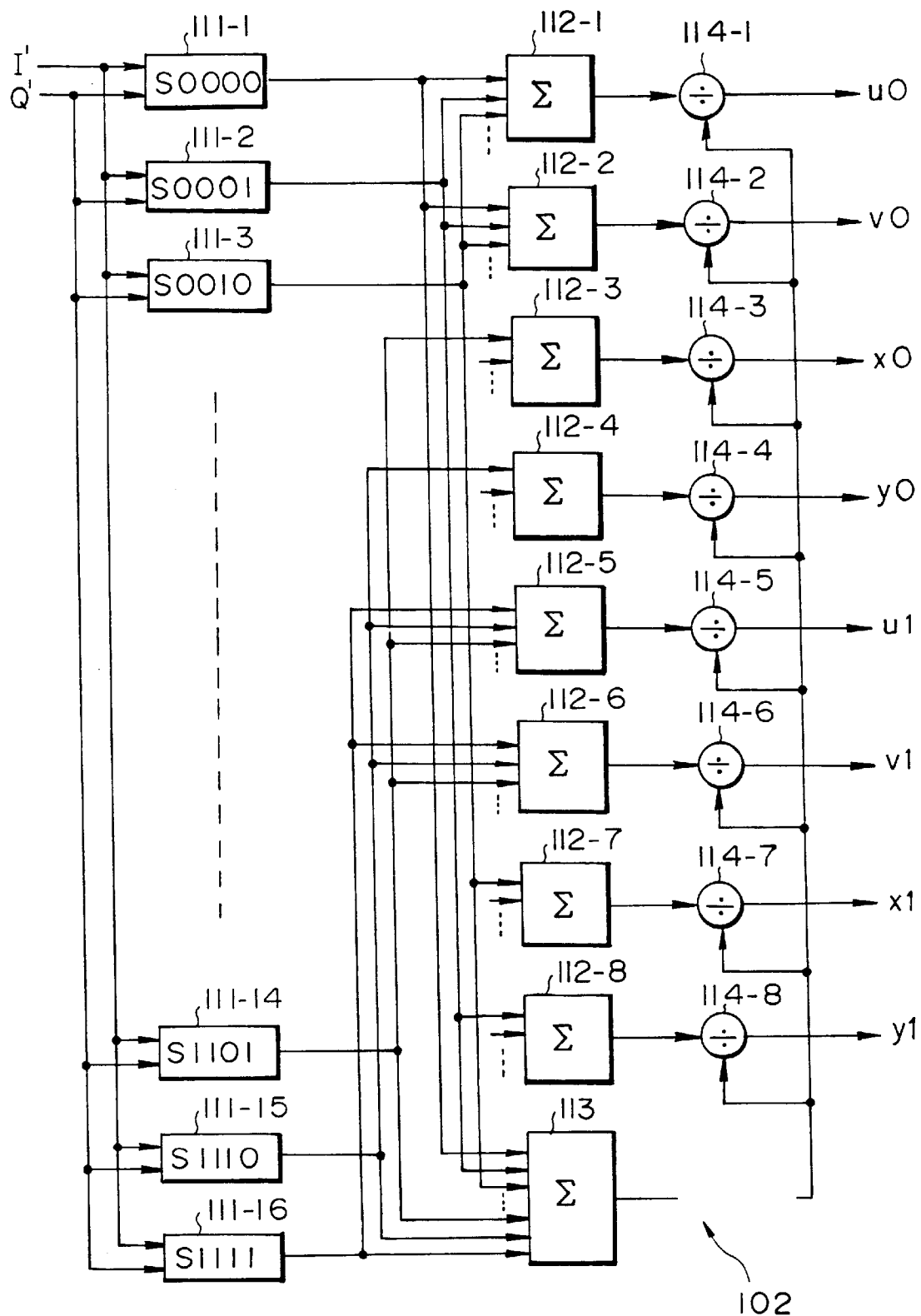
FIG. 3 is a block diagram showing the configuration of an example of the metric calculation circuit 102 shown in FIG. 2.

The bit metric calculation circuit 102 is arranged to calculate pairs of bit metrics from the supplied I and Q signal components I' and Q' with respect to the first to fourth bits denoted by each received signal. The configuration of metric calculation circuit 102 is shown in FIG. 3. I' and Q' signals supplied from the symbol diffusion reversal circuit 33 are input to n probability calculation circuits 111-1 to 111-n, as shown in FIG. 3. In this case, the number n is 16. That is, because signal point assignment processing at the transmitter was performed in accordance with the 16-QAM symbol set, each received signal represents one of the 16 possible symbols in the 16-QAM symbol set or signal constellation shown in FIG. 18.

Figure 18:
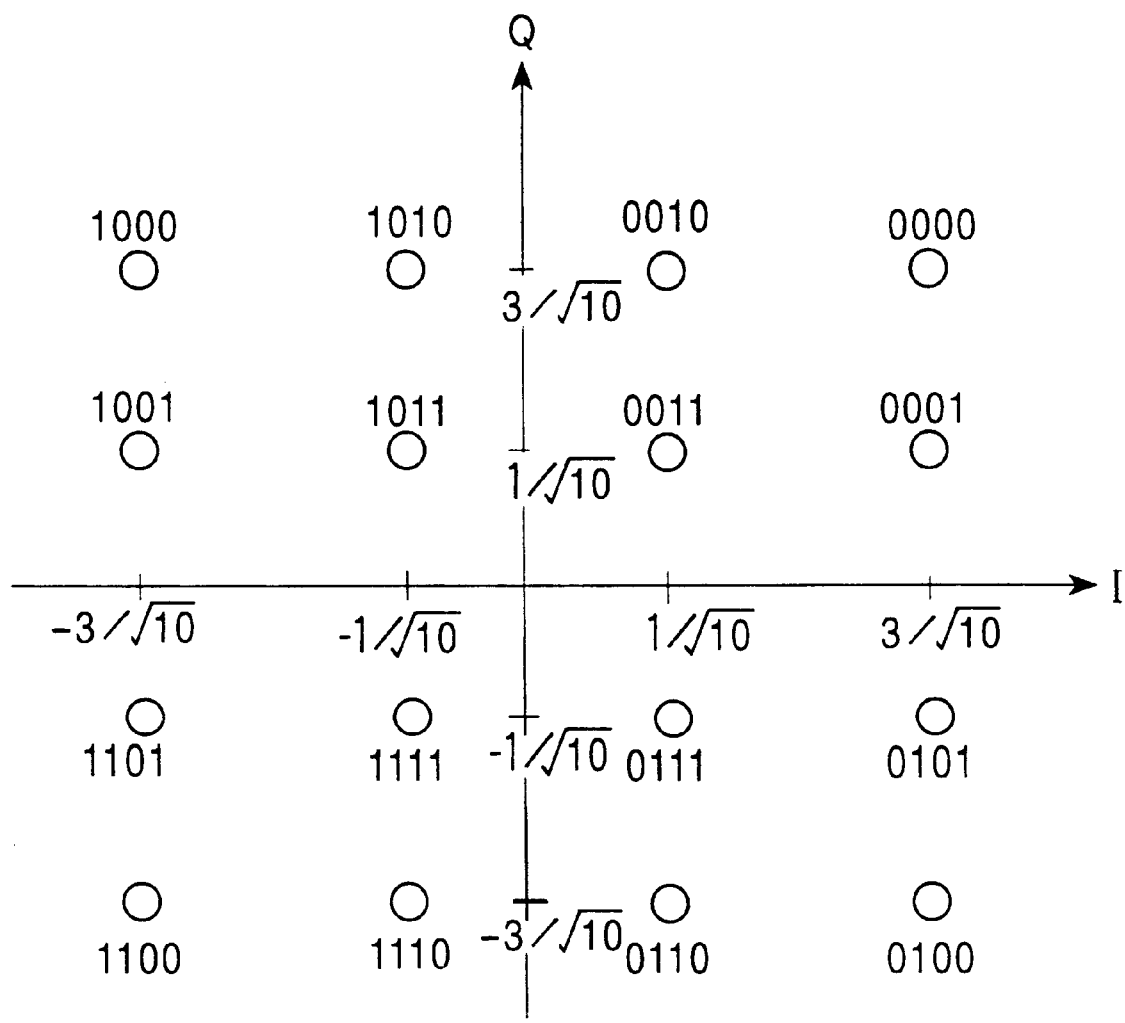
FIG. 18 is a diagram showing a signal constellation of 16-QAM.
Figure 19:
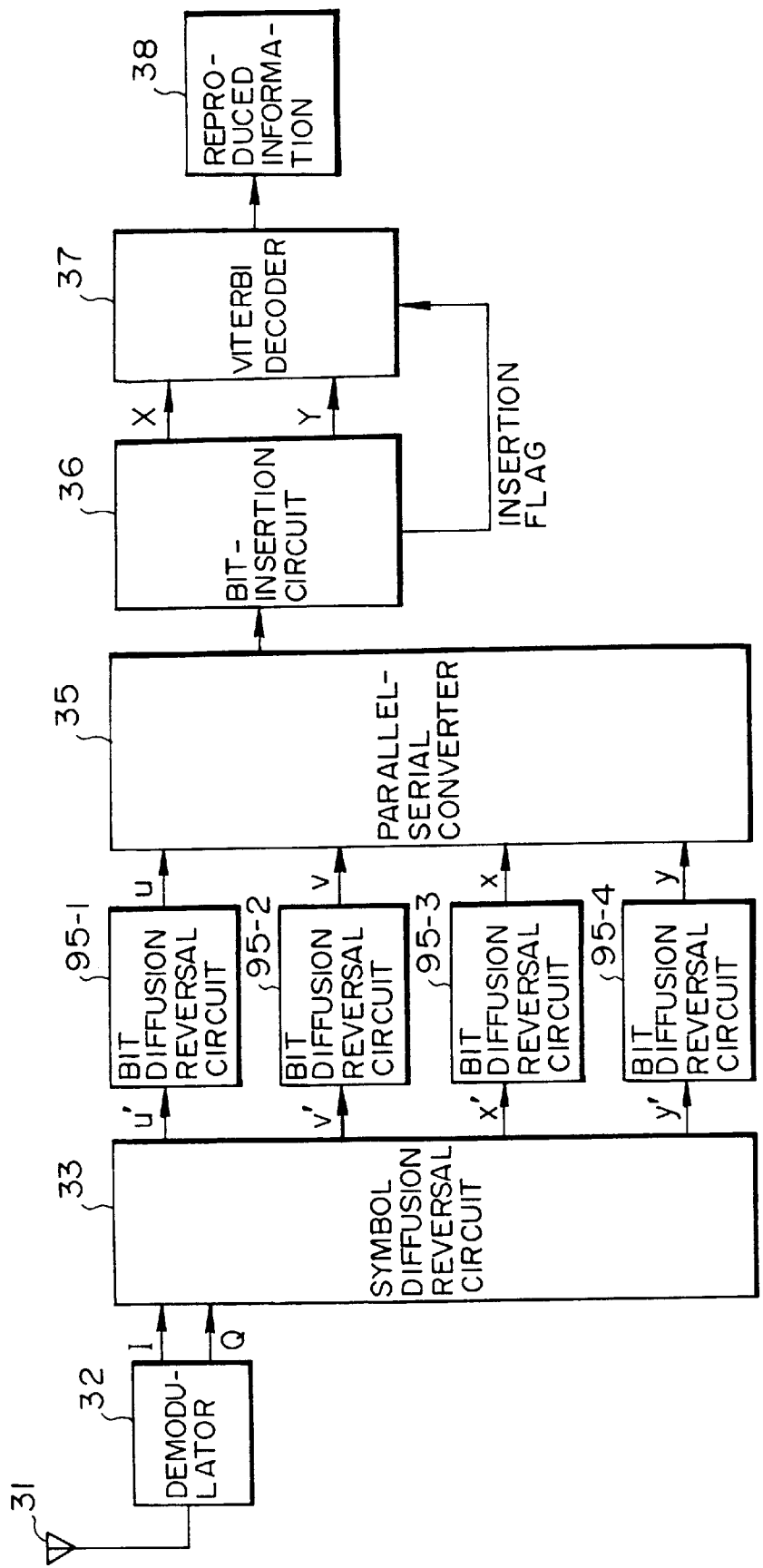
FIG. 19 is a diagram showing the configuration of a hypothetical data receiver for receiving data transmitted by the transmitter shown in FIG. 17.

The probability calculation circuit 111-1 calculates probability P(S0000∩R) of transmission of symbol S0000 corresponding to 0000 in the 16-QAM system shown in FIG. 18 and reception of received signal R. The other probability calculation circuits also perform similar calculations. That is, the probability calculation circuit 111-2 calculates probability P(S0001∩R) of transmission of symbol S0001 corresponding to 0001 in the 16-QAM system and reception of received signal R. The probability calculation circuit 111-3 calculates probability P(S0001∩R) of transmission of symbol S0010 corresponding to 0010 in the 16-QAM system and reception of received signal R. The probability calculation circuit 111-16 calculates probability P(S1111∩R) of transmission of symbol S1111 corresponding to 1111 in the 16-QAM system and reception of received signal R.

Adder circuit 112-1 receives outputs from the probability calculation circuits 111-i for calculating the probabilities with respect to the symbols each having 0 as the first bit, i.e., symbols S0000, S0001, S0010, S0011, S0100, S0101, S0110 and S0111, and calculates the sum of these probabilities. Each of the adder circuits 112-2 through 112-4 receives outputs from the probability calculation circuits 111-i for calculating the probabilities with respect to the symbols each having 0 as the second, third or fourth bit, and calculates the sum of these probabilities.

Adder circuit 112-5 receives outputs from the probability calculation circuits 111-i for calculating the probabilities with respect to the symbols each having 1 as the first bit, i.e., symbols S1111, S1110, S1101, S1100, S1011, S1010, S1001 and S1000, and calculates the sum of these probabilities. Each of the adder circuits 112-6 through 112-8 receives outputs from the probability calculation circuits 111-i for calculating the probabilities with respect to the symbols each having 1 as the second, third or fourth bit, and calculates the sum of these probabilities.

Adder circuit 113 receives outputs from the probability calculation circuits 111-i for calculating the probabilities with respect to all of the 16-QAM symbols, i.e., symbols S0000 to S1111, and calculates the sum of these probabilities. Divider circuits 114-1 through 114-8 respectively divide outputs from the adder circuits 112-1 through 112-8 by an output from the adder circuit 113.

Outputs from the divider circuits 114-1 to 114-4 are supplied to the parallel-serial converter 103 as u0, v0, x0, and y0, while outputs from the divider circuits 114-5 to 114-8 are supplied as u1, v1, x1, and y1.

The operation of the data receiver depicted in FIG. 2 begins with a signal received by the antenna 31 and demodulated by the demodulator 32, thereby providing data in the form of I and Q components of the received signals. These symbol I and Q components undergo diffusion reversal processing by the operation of the symbol diffusion reversal circuit 33 in a manner opposite to that of the symbol diffusion circuit 7 shown in FIG. 1. Circuit 33 reorders the incoming sequence of received signals. The reordered sequence of received signal components I' and Q' is obtained.

The symbol diffusion reversal operation, if expressed by using the same N and G as those used with respect to the symbol diffusion circuit 7, is the replacement of a vector formed of received signals before diffusion reversal processing (S1, S2, . . . , Sn, . . . , SN−1) with a vector formed of signals after diffusion reversal processing (S'1, S'2, . . . , S'k, . . . , S'N−1). In these expressions, Sn=S'k (n=G^k mod N).

Bit metric calculation in the metric calculation circuit 102 will be described next. The bit metrics calculated by circuit 102 represents a conditional posterior probability prescribed in the following expression with respect to each of the bits forming a predetermined received signal when the signal is received:

$$P(bi=0|R)=P(bi=0 \cap R)/P(R) \qquad (3)$$

In this equation, P(bi=0|R) represents the conditional posterior probability that the bit i (bi, the first, second, third or fourth bit) of a transmitted symbol is 0 when signal R(Ir, Qr) (Ir=I', Qr=Q') is received, P(R) represents the probability of signal R(Ir, Qr) being received, and P(bi=0∩R) represents the probability of transmission of a symbol in which the bit i is 0 and received signal R(Ir, Qr) is received.

Similarly, the conditional posterior probability that the bit i of a transmitted symbol is 1 when received signal R(Ir, Qr) is received can be obtained by the following equation:

$$P(bi=1|R)=P(bi=1 \cap R)/P(R) \qquad (4)$$

In this equation, P(bi=1|R) represents the conditional posterior probability that the bit i of a transmitted symbol is 1 when received signal R(Ir, Qr) is received, P(R) represents the probability of received signal R(Ir, Qr) being received, and P(bi=1∩R) represents the posterior probability of transmission of a symbol in which the bit i is 1 and received signal R(Ir, Qr) is received.

The conditional posterior probability that the bit i of a transmitted symbol is 1 when received signal R(Ir, Qr) is received can also be obtained by the following equation:

$$P(bi=1|R)=1-P(bi=0|R) \qquad (5)$$

The metric calculation circuit 102 calculates metrics for the first and fourth bits constituting 16-QAM symbols from the input I component I' and Q component Q', and outputs:

u0 representing metric P(b1=0|R) with respect to the case where the first bit is 0;

v0 representing metric P(b2=0|R) with respect to the case where the second bit is 0;

x0 representing metric P(b3=0|R) with respect to the case where the third bit is 0;

y0 representing metric P(b4=0|R) with respect to the case where the fourth bit is 0;

u1 representing metric P(b1=0|R) with respect to the case where the first bit is 1;

v1 representing metric P(b2=0|R) with respect to the case where the second bit is 1;

x1 representing metric P(b3=0|R) with respect to the case where the third bit is 1; and y1 representing metric P(b4=0|R) with respect to the case where the fourth bit is 1.

In the embodiment shown in FIG. 3, metrics are calculated in accordance with the above-described equations (3) and (4). That is, each of the metrics for the bits whose value is 0 is obtained as follows.

$$P(bi=0|R)$$

$$=P(bi=0\cap R)/P(R) \quad (6)$$

$$=((1/16)\Sigma P(S_j\cap R))/((1/16)\Sigma P(S_k\cap R)) \quad (7)$$

$$=(\Sigma P(S_j\cap R)/(\Sigma P(S_k\cap R)) \quad (8)$$

Each of the metrics for the bits whose value is 1 is obtained as follows.

$$P(bi=1|R)$$

$$=P(bi=1\cap R) \quad (9)$$

$$=((1/16)\Sigma P(S_m\cap R))/((1/16)\Sigma P(S_k\cap R)) \quad (10)$$

$$=(\Sigma P(S_m\cap R)/(\Sigma P(S_k\cap R)) \quad (11)$$

In the former equation, $P(S_j\cap R)$ represents the probability of transmission of symbol $S_j$ and reception of received signal R, and $\Sigma P(S_j\cap R)$ represents the sum of the probabilities $P(S_j\cap R)$ of all symbols $S_j$ in which the bit i is 0.

In the latter equation, $P(S_m\cap R)$ represents the probability of transmission of symbol $S_m$ and reception of received signal R, and $\Sigma P(S_m\cap R)$ represents the sum of the probabilities $P(S_m\cap R)$ of all symbols $S_m$ in which the bit i is 1.

On the other hand, $P(S_k\cap R)$ represents the probability of transmission of symbol $S_k$ and reception of received signal R, and $\Sigma P(S_k\cap R)$ represents the sum of the probabilities $P(S_k\cap R)$ of all symbols Sk defined in the 16-QAM system.

In the metric calculation circuit 102 shown in FIG. 3, the probability calculation circuit 111-1 calculates P(S0000∩R), i.e., the probability of transmission of symbol S0000 corresponding to 0000 in the 16-QAM system and reception of received signal R.

The probability calculation circuit 111-2 calculates P(S0001 ∩R), i. e., the probability of transmission of symbol S0001 corresponding to 0001 in the 16-QAM system and reception of received signal R.

The probability calculation circuit 111-3 calculates P(S0010∩R), i.e., the probability of transmission of symbol S0010 corresponding to 0010 in the 16-QAM system and reception of received signal R.

The probabilities are calculated in the same manner with respect to the other 16-QAM symbols. Thus, sixteen probabilities in all are obtained as calculation results.

The adder circuit 112-1 calculates the numerator of equation (8), i.e., the sum of the probabilities with respect to the symbols each having 0 as the first bit:

S0000, S0001, S0010, S0011,
S0100, S0101, S0110, S0111.

Each of the adder circuits 112-2 through 112-4 calculates the sum of the probabilities with respect to the symbols each having 0 as the second, third or fourth bit.

The divider circuits 114-1 to 114-4 are calculators for dividing the outputs of the adder circuits 112-1 through 112-4 by the output of the adder circuit 113, i.e., performing the calculation shown by equation (8).

The adder circuit 113 is a circuit for calculating the denominator of equation (8) or equation (11), i.e., the sum of the probabilities with respect to all the 16-QAM symbols:

S0000, S0001, S0010, S0011,
S0100, S0101, S0110, S0111,
S1000, S1001, S1010, S1011,
S1100, S1101, S1110, S1111.

The outputs from the divider circuits 114-1 through 114-4 are supplied as u0, v0, x0, and y0 to the parallel-serial converter 103.

The adder circuit 112-5 is a circuit for calculating the numerator of equation (11), i.e., the sum of the probabilities with respect to the symbols each having 1 as the first bit:

S1111, S1110, S1101, S1100,
S1011, S1010, S1001, S1000.

Each of the adder circuits 112-5 through 112-8 calculates the sum of the probabilities with respect to the symbols having 1 as the second, third or fourth bit.

The divider circuits 114-5 through 114-8 are calculators for dividing the outputs of adder circuits 112-5 through 112-8 by the output of the adder circuit 113, i.e., performing the calculation shown by equation (11).

The outputs of divider circuits 114-5 through 114-8 are supplied as u1, v1, x1, and y1 to the parallel-serial converter 103.

Thus, the bit metric calculation circuit 102 supplies sequences of bit metrics u0, v0, x0, y0 and u1, v1, x1, y1. These sequences include a first bit metric for each bit representing the probability that a bit value of 0 was sent and a second bit metric for each bit representing the probability that a bit value of 1 was sent. Thus, the first and second bit metrics u0, u1 derived from one received signal form a pair of bit metrics for the first bit denoted by that received signal; bit metrics v0, v1 form a pair of bit metrics for the second bit denoted by the received signal, whereas the remaining bit metrics x0, x1 and y0, y1 form similar pairs of bit metrics for the third and fourth bits denoted by the received signal. The sequences of bit metric pairs are processed by the operation of the subsequent parallel-serial converter 103 in a manner opposite to that of the serial-parallel converter 4 shown in FIG. 1. The parallel-serial converter 103 converts the sequences of bit metric pairs sequences into one sequence of bit metric pairs (Pr0, Pr1).

The bit insertion circuit 104 performs the operation in a manner opposite to that of the bit erase circuit 3 shown in FIGS. 1 and 17. That is, the erase map shown above:

X: 10
Y: 11 is used to insert an arbitrary dummy data item ((0, 0) in this case) in the sequence of bit metric pairs which are input as (Pr0, Pr1) in the order of (u10, u11), (v10, v11), (x10, x11), (y10, y11), (u20, u21), (v20, v21), (x20, x21), (y20, y21) . . . Dummy data items are inserted periodically at the positions immediately before every third data item in the data sequence, so that (u10, u11), (0, 0), (y10, y11), (0, 0), (x20, x21), etc. . . . are output as data X (X0, X1) in this order, and (v10, v11), (x10, x11), (u20, u21), (v20, v21) (y20, y21), etc . . . are output as data Y (Y0, Y1) in this order. Also, a flag indicating the position of insertion of each dummy data item is supplied to the Viterbi decoder 105.

Figure 4:
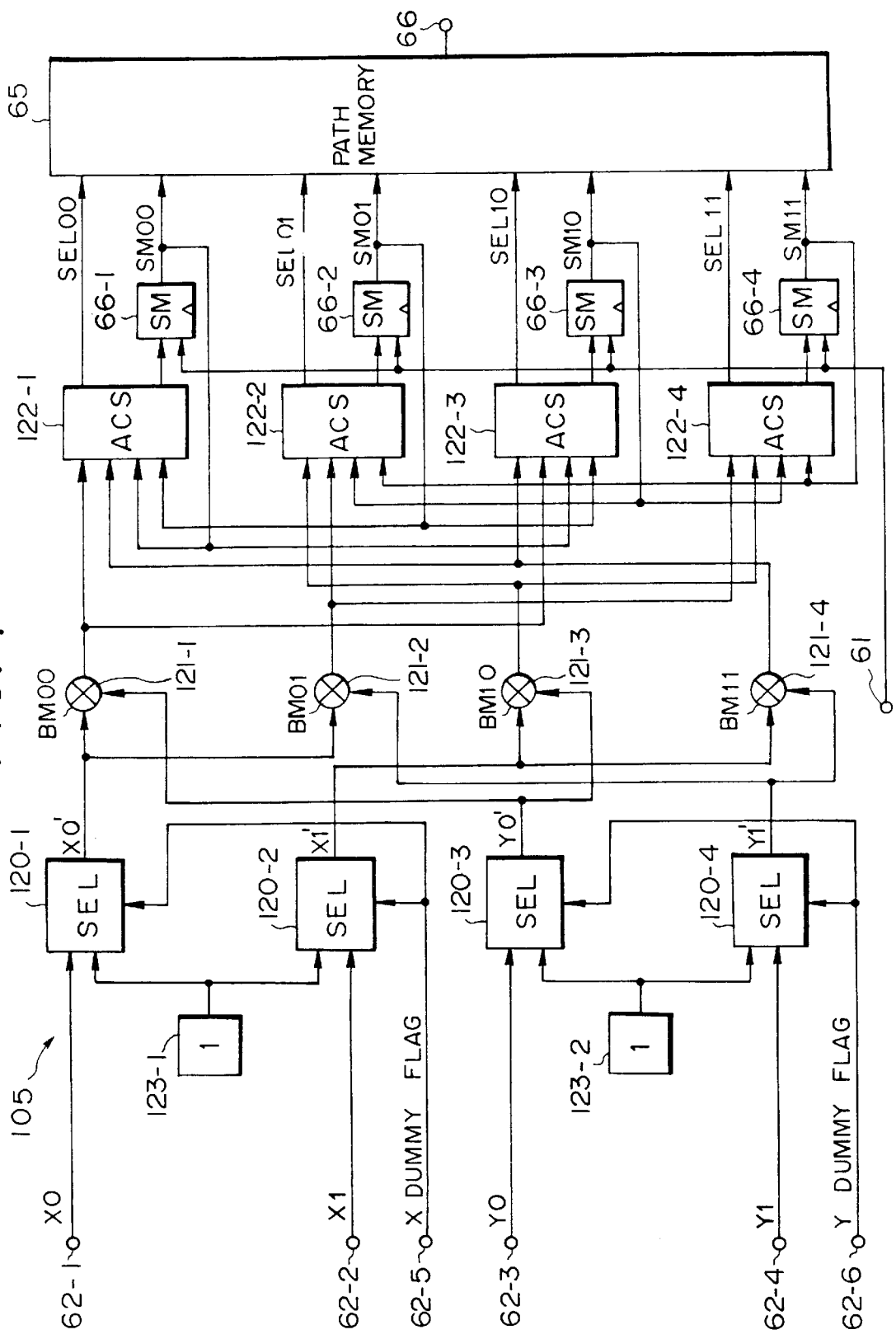
FIG. 4 is a block diagram showing the configuration of an example of the bit insertion circuit 104 shown in FIG. 2.

The Viterbi decoder 105 performs Viterbi decoding in accordance with the state transitions of the convolutional encoder 2 to obtain reproduced information 38. FIG. 4 depicts the configuration of an example of the Viterbi decoder 105. Metrics X0, X1, Y0, and Y1 output from the bit insertion circuit 104 shown in FIG. 2 are supplied to input terminals 62-1 through 62-4, respectively. X and Y dummy flags supplied from the bit insertion circuit 104 are input to input terminals 62-5 and 62-6, respectively. When the selectors 120-1 and 120-2 are supplied with an X dummy flag via input terminal 62-5, they select and output the value 1 which is output from a generator circuit 123-1. When the selectors 120-1 and 120-2 are not supplied with an X dummy flag, they respectively select metrics X0 and X1 input via input terminals 62-1 and 62-2 and output these metrics as metrics X0' and X1'.

Selectors 120-3 and 120-4 are arranged in the same manner as selectors 120-1 and 120-2. When selectors 120-3 and 120-4 are supplied with a Y dummy flag, they select and output the value 1 which is output from a generator circuit 123-2. When selectors 120-3 and 120-4 are not supplied with a Y dummy flag, they respectively select metrics Y0 and Y1 input via input terminals 62-3 and 62-4 and output these metrics as metrics Y0' and Y1'.

In the present embodiment, the Y dummy flag is never set. Therefore, Y0'=Y0, and Y1'=Y1.

Multiplier circuit 121-1 is arranged to calculate the product of metric X0' output from selector 120-1 and metric Y0' output from selector 120-3 and to output the product as branch metric BM00. Multiplier circuit 121-2 is arranged to calculate the product of metric X0' output from selector 120-1 and metric Y1' output from selector 120-4 and to output the product as branch metric BM01. Multiplier circuit 121-3 is arranged to calculate the product of metric X1' output from selector 120-2 and metric Y0' output from selector 120-3 and to output the product as branch metric BM10. Multiplier 121-4 is arranged to calculate the product of metric X1' output from selector 120-2 and metric Y1' output from selector 120-4 and to output the product as branch metric BM11.

The output BM00 of the multiplier circuit 121-1 and the output BM11 of the multiplier circuit 121-4 are input to an accumulate compare select (ACS) circuit 122-1. In addition, the output BM01 of the multiplier circuit 121-2 and the output BM10 of the multiplier circuit 121-3 are input to ACS circuit 122-2; the output BM00 of the multiplier circuit 121-1 and the output BM11 of the multiplier circuit 121-4 are input to ACS circuit 122-3; and the output BM01 of the multiplier circuit 121-2 and the output BM10 of the multiplier circuit 121-3 are input to ACS circuit 122-4.

Figure 14:
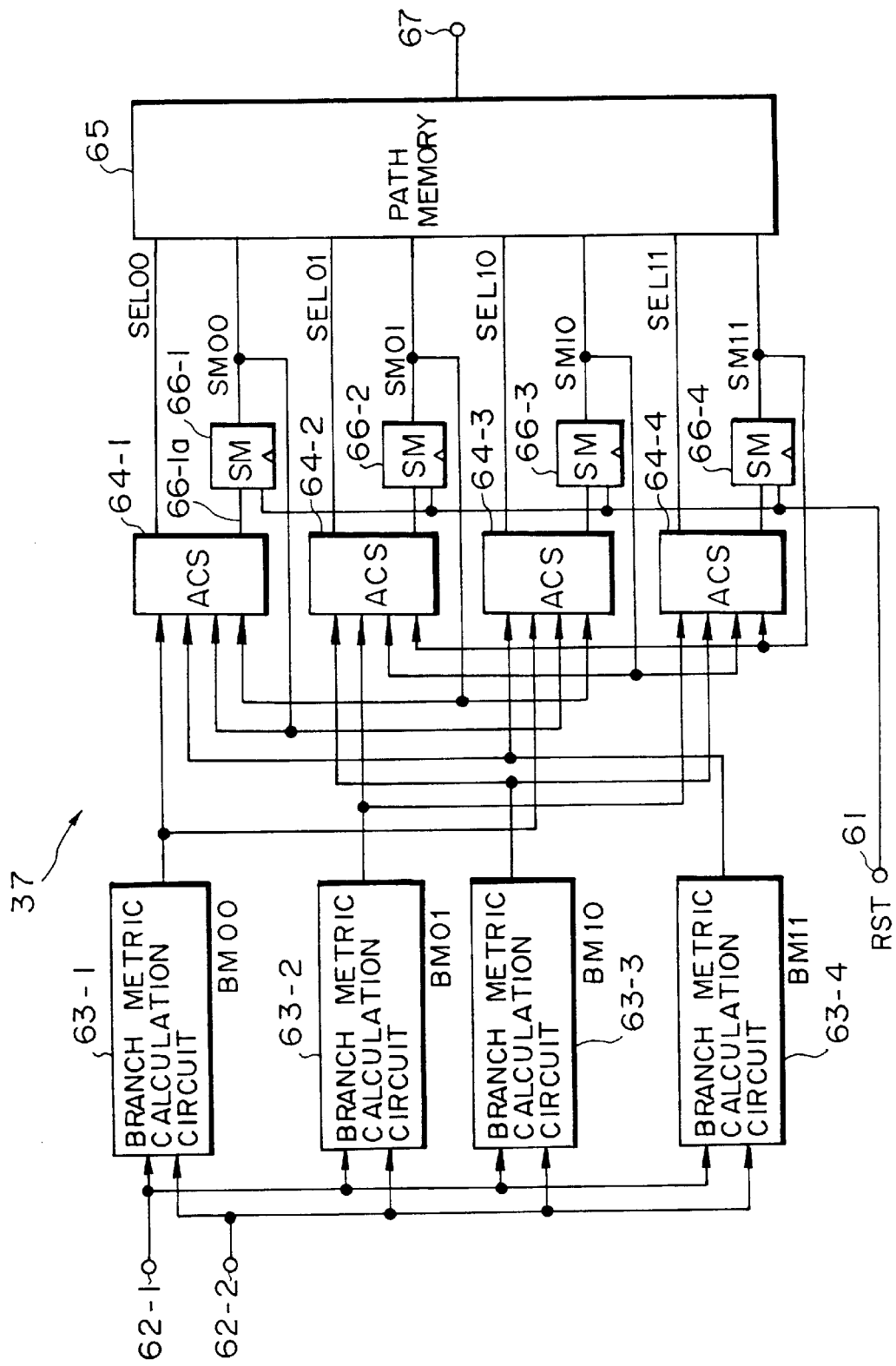
FIG. 14 is a block diagram showing the configuration of an example of the Viterbi decoder shown in FIG. 13.
Figure 15:
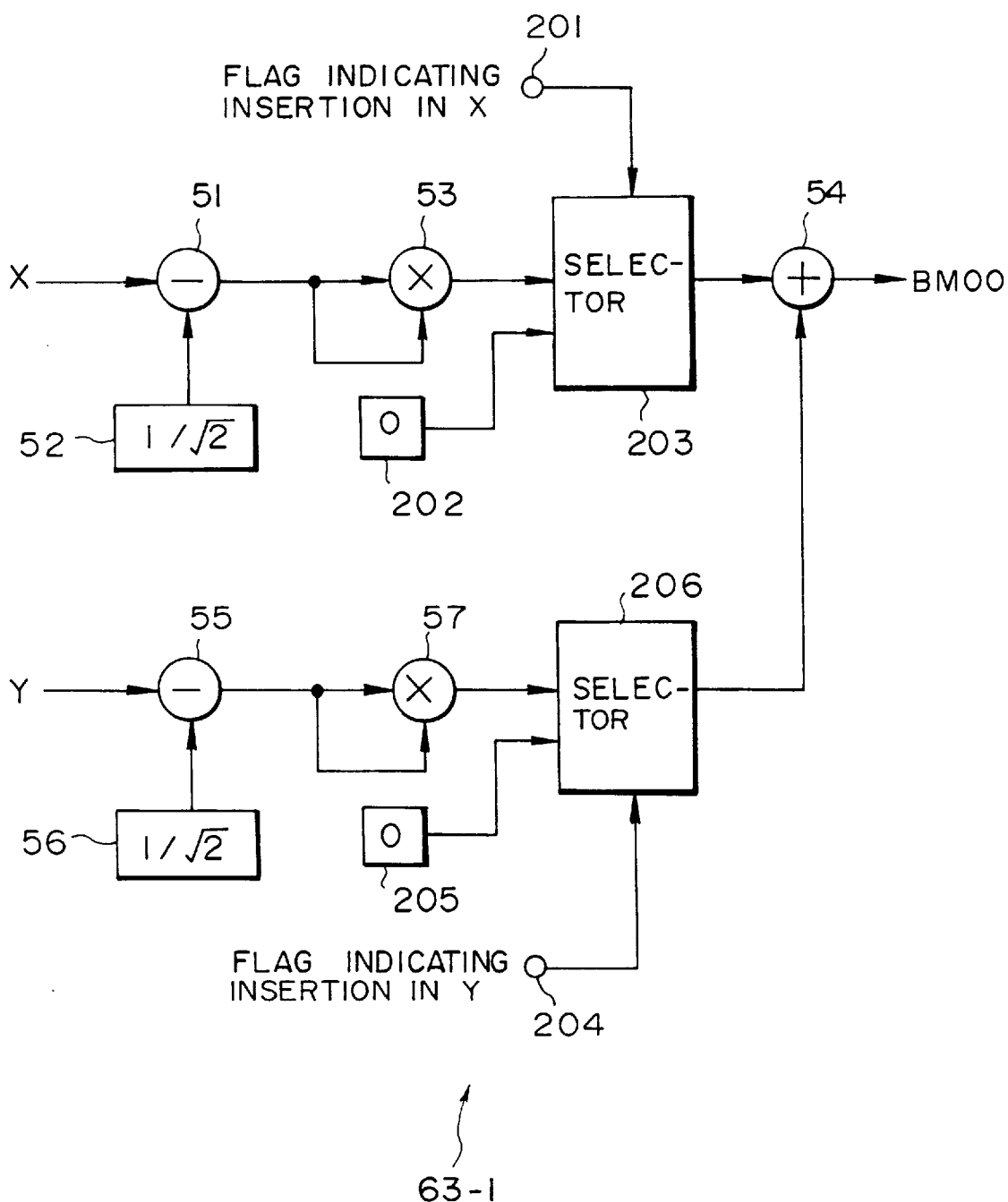
FIG. 15 is a block diagram showing the configuration of an example of the branch metric calculation circuit shown in FIG. 14.

An output (state metric) SM00 from state metric storage 66-1 and an output (state metric) SM01 from state metric storage 66-2 are also input to ACS circuit 122-1. An output (state metric) SM10 from a state metric storage 66-3 and an output (state metric) SM11 from a state metric storage 66-4 are also input to ACS circuit 122-2. Further, the output (state metric) SM00 from the state metric storage 66-1 and the output (state metric) SM01 from the state metric storage 66-2 are input to ACS circuit 122-3 while the output (state metric) SM10 from the state metric storage 66-3 and the output (state metric) SM11 from the state metric storage 66-4 are input to ACS circuit 122-4. In other respects, the configuration of the Viterbi decoder is the same as that shown in FIG. 14.

The operation of the Viterbi decoder 105 will be described next. Multiplier circuit 121-1 calculates the product of metric X0 for the value 0 of one of the bits forming the I component metric and metric Y0 for the value 0 of one of the bits forming the Q component (the probability that the value of the first bit forming the I component is 0 while the value of the second bit forming the Q component is 0), and outputs the product as branch metric BM00. This branch metric BM00 corresponds to the code output 00 of the convolutional encoder 2.

Similarly, multiplier circuit 121-2 calculates the product of metric X0 for the value 0 of one of the bits forming the I component and metric Y1 for the value 1 of one of the bits forming the Q component (the probability that the value of the first bit forming the I component is 0 while the value of the second bit forming the Q component is 1), and outputs the product as branch metric BM01. This branch metric BM01 corresponds to the code output 01 of the convolutional encoder 2.

Multiplier circuit 121-3 calculates the product of metric X1 for the value 1 of one of the bits forming the I component and metric Y0 for the value 0 of one of the bits forming the Q component (the probability that the value of the first bit constituting the I component is 1 while the value of the second bit forming the Q component is 0), and outputs the product as branch metric BM10. This branch metric BM10 corresponds to the code output 10 of the convolutional encoder 2. Multiplier circuit 121-4 calculates the product of metric X1 for the value 1 of one of the bits forming the I component and metric Y1 for the value 1 of one of the bits forming the Q component (the probability that the value of the first bit forming the I component is 1 while the value of the second bit forming the Q component is 1), and outputs the product as branch metric BM11. This branch metric BM11 corresponds to the code output 11 of the convolutional encoder 2.

ACS circuit 122-1 performs the following two calculations according to the state transition (FIG. 11) of the convolutional encoder 2.

$$SM00 \times BM00 \tag{12}$$

$$SM01 \times BM11 \tag{13}$$

In these expressions, SM00 represents the value of the state metric storage 66-1 one unit time before transition, SM01 represents the value of the state metric storage 66-2 one unit time before transition, BM00 represents the result of calculation by multiplier circuit 121-1, and BM11 represents the result of calculation by multiplier circuit 121-4.

ACS circuit 122-1 selects the calculation result with a higher likelihood, i.e., the greater one of the results of the calculations represented by expressions (12) and (13), outputs corresponding selection information SEL00 to the subsequent path memory 65, and supplies the greater one of the results of calculations (12) and (13) to the subsequent state metric storage 66-1. The state metric storage 66-1 stores this calculation result. If the result of calculation (12) is greater, SEL00=0 is set. If the result of calculation (13) is greater, SEL00=1 is set. In the former case, the state metric storage 66-1 stores SM00 BM00 as new state metric SM00. In the latter case, the state metric storage 66-1 stores SM01 BM11 as new state metric SM00.

Figure 11:
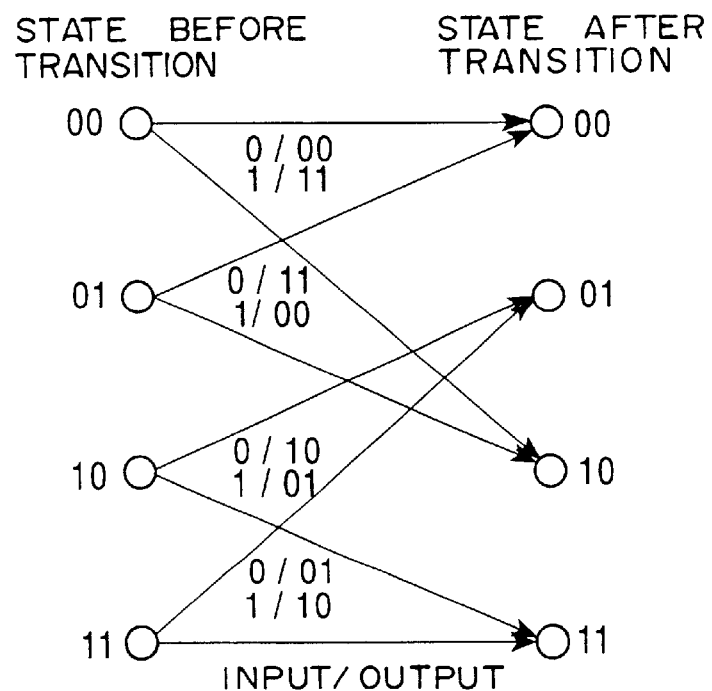
FIG. 11 is a diagram for explaining state transition of the convolutional encoder shown in FIG. 10.
Figure 12:
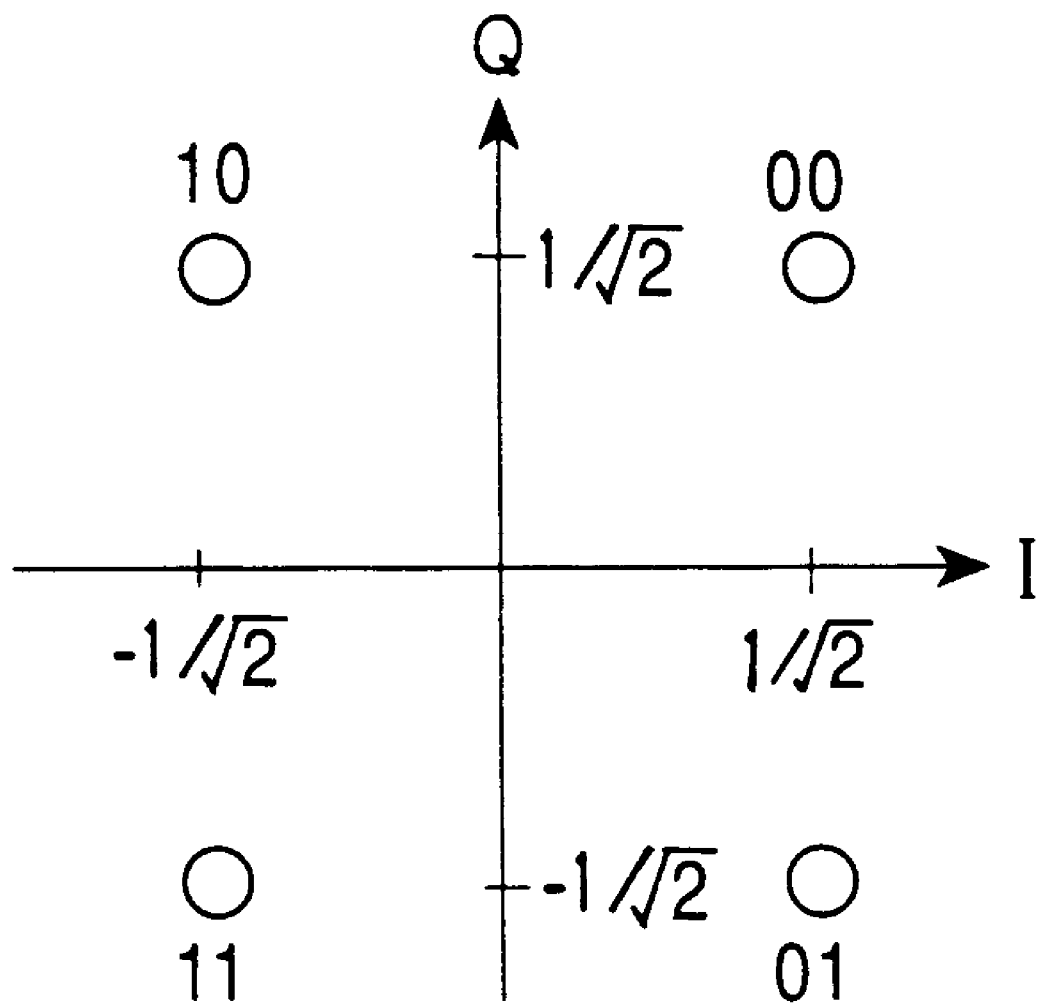
FIG. 12 is a diagram showing a signal constellation of QPSK.

In FIG. 11 there are two paths to the state 00. The first path is defined by input of 0 in the state 00 and by output of 00. A corresponding comparative calculation is represented by expression (12). The second path is defined by input of 0 in the state 01 and by output of 11. A corresponding comparative calculation is represented by expression (13). The greater one of the two calculation results is supplied as new state metric SM00 to the state metric storage 66-1.

Each of the ACS circuits 122-2 through 122-4 also performs the same operation. Each of the state metric storages 66-1 to 66-4 is reset to 0 in an initial stage of the operation of the system. The resetting is performed by a controller (not shown) via the terminal 61.

Figure 16:
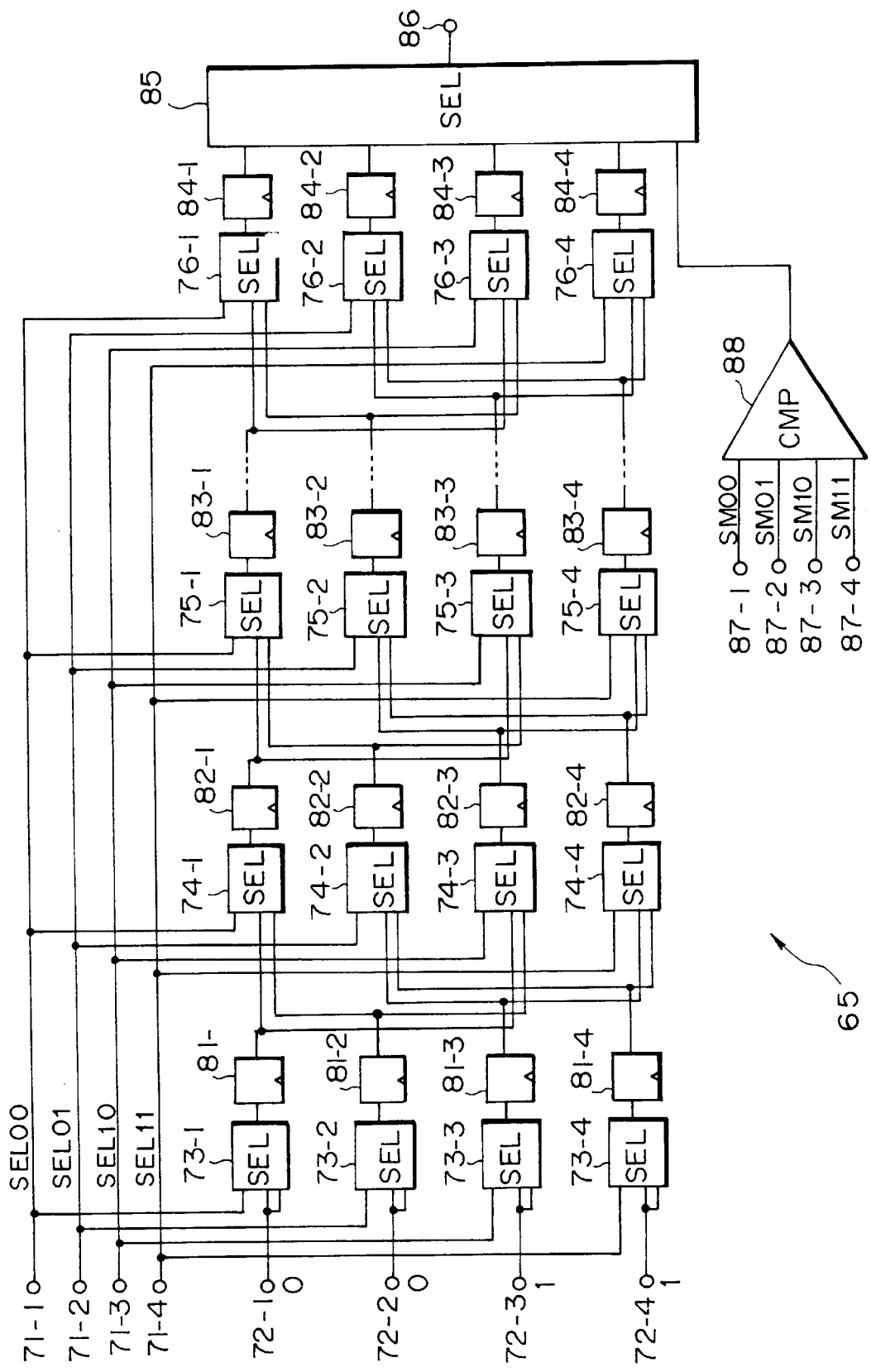
FIG. 16 is a block diagram showing the configuration of an example of the path memory shown in FIG. 14.

The path memory 65 selects, stores, and transmits the decoded data, in accordance with the state transition shown in FIG. 11 by using selection information SEL00 through SEL11 supplied from ACS circuits 122-1 through 122-4. Path memory 65 has the same configuration and operates in the same manner as the path memory shown in FIG. 16.

Various calculation methods are available in probability calculation circuits 111-1 through 111-16 shown in FIG. 3 according to transmission channels. For example, assuming a Gaussian channel, the probability may be calculated in probability calculation circuit 111-1 as follows:

$$P(S0000 \cap R) = (1/(2\pi)^{1/2}\sigma)\exp(-(||S0000-R||^2)/(2\sigma^2)) \quad (14)$$

In this equation, σ represents the square root of 1/2 of the noise power in the transmission channel. Thus, $2\sigma^2$ represents the noise power in the transmission channel. ||S0000–R|| is the Euclidian distance between symbol S0000 and received signal R.

The value of σ used by the receiver may be preset when the receiver is constructed, based on the expected characteristics of the transmission channel. Alternatively, the receiver can be arranged to adapt itself to the conditions of the transmission channel, as by trying various values of σ and testing for errors in the resulting data. However, since the value of σ is the same for all of the probability calculations for individual symbols, the value of σ does not influence the results. Therefore, σ can be omitted in the receiver; i.e., σ can be assigned an arbitrary value of 1 in equation (14).

Probabilities can be calculated in the same manner in probability calculation circuits 111-2 through 111-16.

Figure 5:
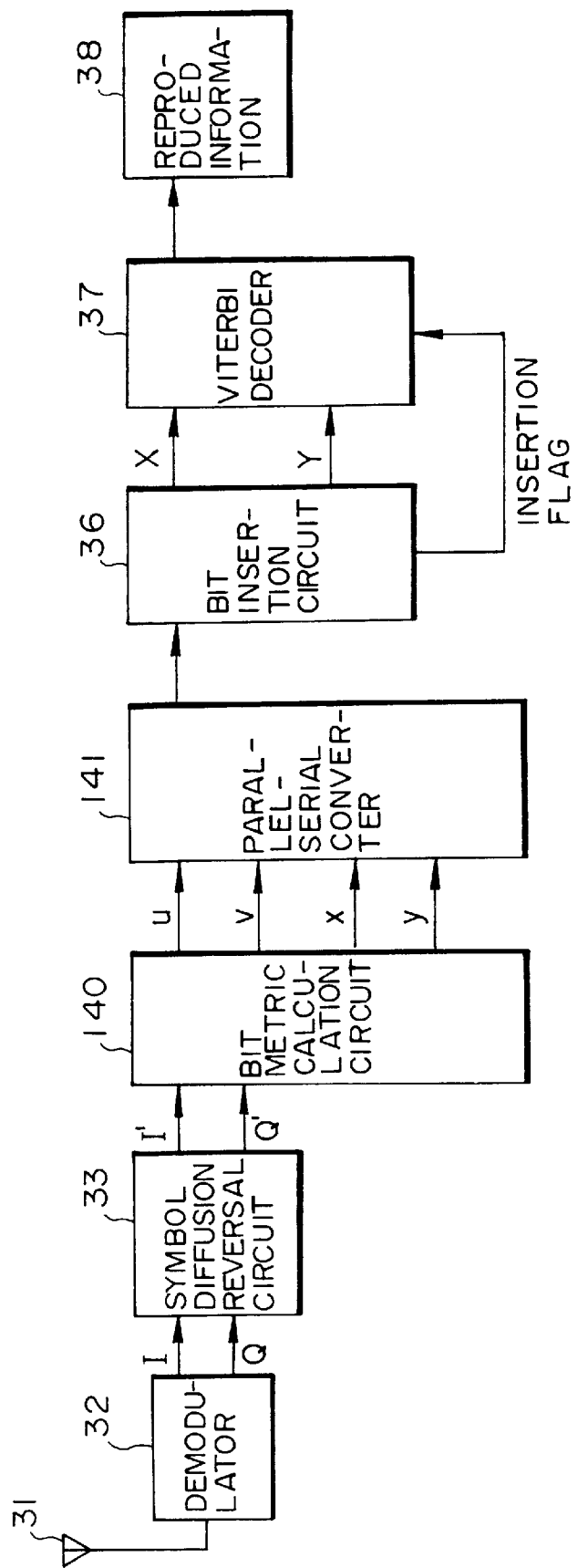
FIG. 5 is a block diagram showing the configuration of a data receiver which represents a second embodiment of the present invention.
Figure 6:
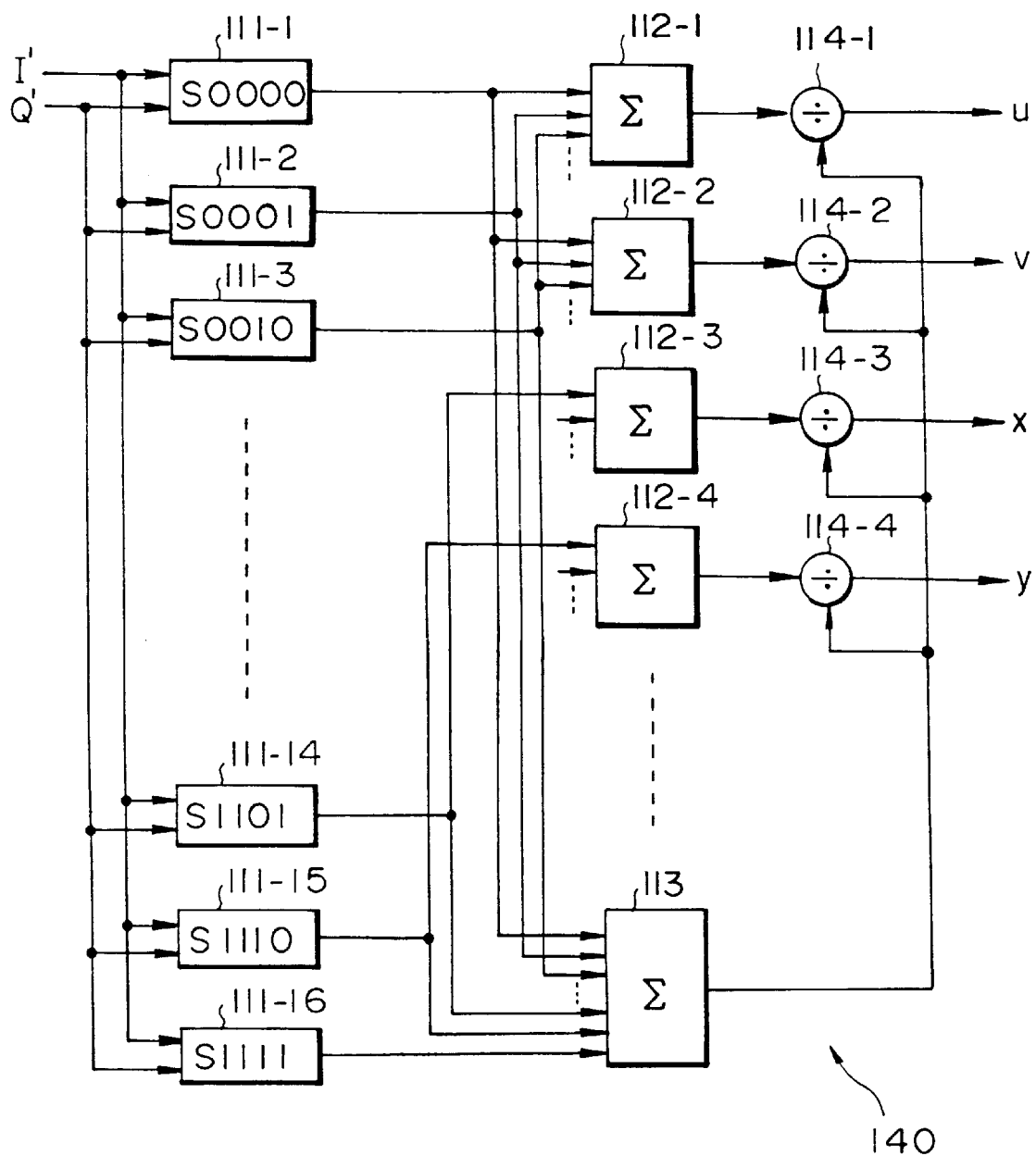
FIG. 6 is a block diagram showing the configuration of an example of the metric calculation circuit 140 shown in FIG. 5.

FIG. 5 shows a data receiver according to a second embodiment of the present invention. In this embodiment, a bit metric calculation circuit 140 is arranged to calculate metrics (u, v, x, y) for the value 0 of the first through fourth bits denoted by each received signal. These bit metrics correspond to the first bit metrics u0, x0, and y0 calculated for each bit in the embodiment discussed above. A parallel-serial converter 141 converts the metric data sequences from the metric calculation circuit 140 into one data sequence. The configuration of this embodiment is the same as that shown in FIG. 2 in all other respects. A signal received by antenna 31 is demodulated by demodulator 32, thereby extracting I and Q components. The symbol diffusion reversal circuit 33 obtains data I' and Q' by diffusion reversal processing in a manner of operation opposite to that of the symbol diffusion circuit 7 shown in FIGS. 1 and 17. Metric calculation circuit 140 is arranged to perform the same bit-0 metric calculation as the metric calculation circuit 102 shown in FIG. 2. The configuration of metric calculation circuit 140, as shown in FIG. 6, is such that adder circuits 112-5 through 112-8 and divider circuits 114-5 through 114-8 shown in FIG. 3 are removed.

Metric data (u, v, x, y) output from metric calculation circuit 140 are input to parallel-serial converter 141 which converts the input data into one serial data sequence in a manner of operation opposite to that of the serial-parallel converter 4 shown in FIGS. 1 and 17, and outputs the converted data into bit insertion circuit 36. Bit insertion circuit 36 performs the operation in a manner inverse opposite to that of bit erase circuit 3 of the transmitter shown in FIGS. 1 and 17. That is, the above-described erase map:

X: 10
Y: 11 is used to insert an arbitrary dummy data item (0 in this embodiment) in the data sequence and the data sequence is split into two sequences X and Y. The data input to insertion circuit 36 is provided by parallel-serial converter 35 in the order u1, v1, x1, y1, u2, v2, x2, y2

Dummy data items are inserted periodically at the positions immediately before every third bit in the data sequence, so that u1, 0, y1, 0, x2, . . .

are output as data X in this order, and v1, x1, u2, v2, y2, are also output as data Y in this order.

Data sequences X and Y are output from the bit insertion circuit 36 to a Viterbi decoder 37. Also, the bit insertion circuit provides a flag indicating the position of insertion of each dummy data item to the Viterbi decoder 37.

Figure 7:
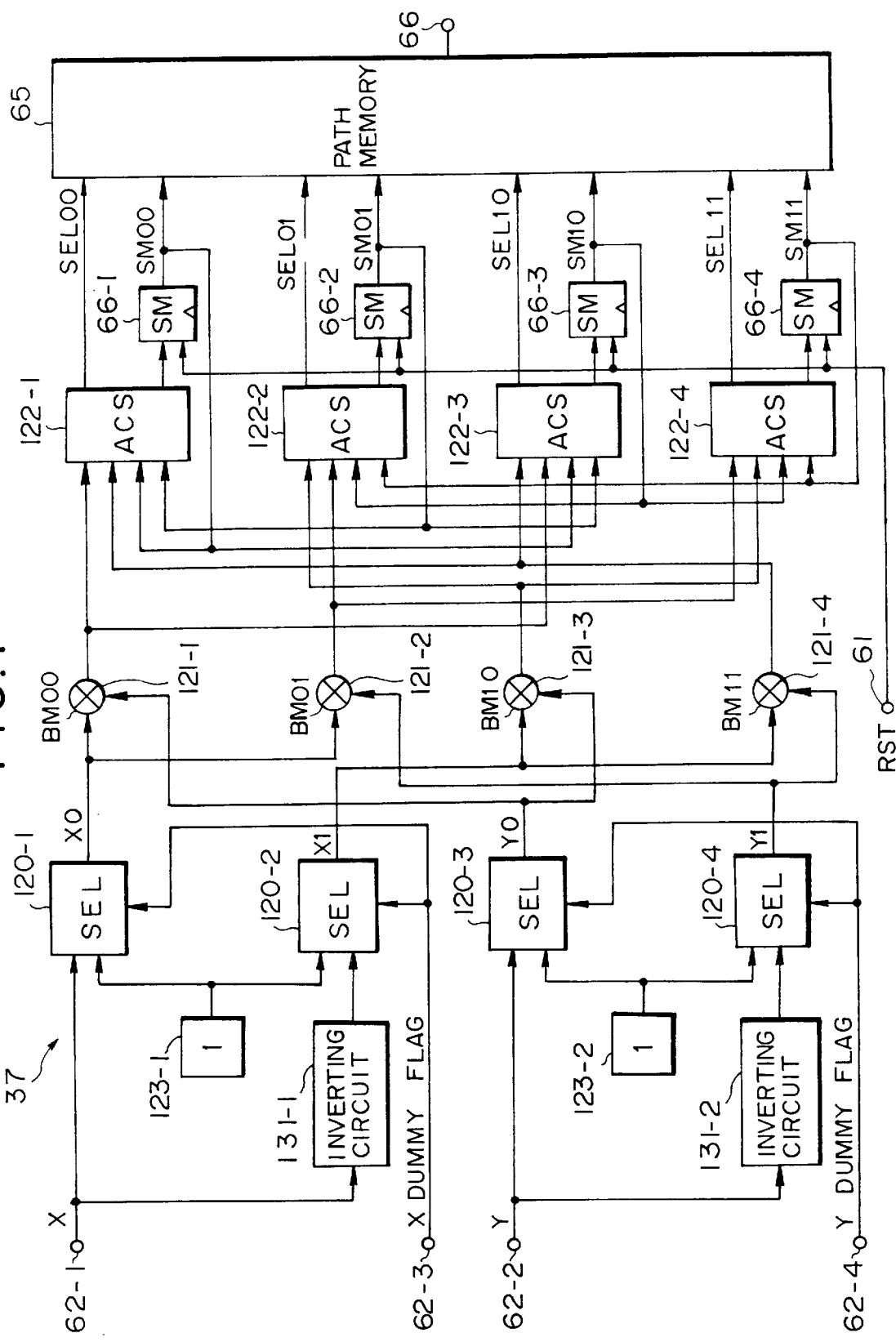
FIG. 7 is a block diagram showing the configuration of an example of the Viterbi decoder 37 shown in FIG. 5.

FIG. 7 shows the configuration of an example of the Viterbi decoder 37 shown in FIG. 5. In this example, data X (bit metrics) is input to an input terminal 62-1 while data Y (bit metrics) is input to an input terminal 62-2. X and Y dummy flags are input to input terminals 62-3 and 62-4, respectively.

Inverting circuits 131-1 and 131-2 are arranged to invert the bits of data X and Y, respectively, and to output the inverted bits. Each of generator circuits 123-1 and 123-2 is arranged to generate and output a data item 1. Selectors 120-1 and 120-2 are arranged to change inputs according to an X dummy flag and to output the input data: Selectors 120-3 and 120-4 are arranged to change inputs according to a Y dummy flag and to output the input data. The configuration of this Viterbi decoder is the same as that shown in FIG. 4 in all other respects.

Data X supplied to input terminal 62-1 is input to selector 120-1 and inverting circuit 131-1. Inverting circuit 131-1 inverts data X and supplies the inverted data to selector 120-2. When selector 120-1 is supplied with an X dummy flag via input terminal 62-3, it selects the value 1 output from the generator circuit 123-1 and outputs this value as data X0. When selector 120-1 is not supplied with an X dummy flag, it selects data X from input terminal 62-1 and outputs data X as data X0. When selector 120-2 is supplied with an X dummy flag, it selects the value 1 output from the generator circuit 123-1. When selector 120-2 is not supplied with an X dummy flag, it selects data X having all the bits inverted by inverting circuit 131-1. Selector 120-2 outputs the selected data as data X1.

Data Y supplied to input terminal 62-2 is input to selector 120-3 and inverting circuit 131-2. Inverting circuit 131-2 inverts data Y and supplies the inverted data to selector 120-4. When selector 120-3 is supplied with a Y dummy flag via input terminal 62-4, it selects the value 1 output from the generator circuit 123-2 and outputs this value as data Y0. When selector 120-3 is not supplied with a Y dummy flag, it selects data Y from input terminal 62-2 and outputs data Y as data Y0. When selector 120-4 is supplied with a Y dummy flag, it selects the value 1 output from the generator circuit 123-2. When selector 120-4 is not supplied with a Y dummy flag, it selects data Y having all the bits inverted by inverting circuit 131-2. Selector 120-4 outputs the selected data as data Y1.

The multiplier circuit 121-1 multiplies data X0 output from the selector 120-1 and data Y0 output from the selector 120-3 together, and outputs the result of this multiplication as branch metric BM00. That is, the Multiplier circuit 121-1 calculates the product of metric data X0 corresponding to the metric for the value 0 of one of the bits forming the I component and metric data Y0 corresponding to the metric for the value 0 of one of the bits forming the Q component (the probability that the value of the first bit forming the I component is 0 while the value of the second bit forming the Q component is 0), and outputs the product as branch metric BM00. This branch metric BM00 corresponds to the code output 00 of the convolutional encoder 2.

Similarly, the multiplier circuit 121-2 multiplies data output X0 output from the selector 120-1 and data Y1 output from the selector 120-4 together, and outputs the result of this multiplication as branch metric BM01. That is, the multiplier circuit 121-2 calculates the product of metric data X0 for the value 0 of one of the bits forming the I component and metric data Y1 for the value 1 of one of the bits forming the Q component (the probability that the value of the first bit forming the I component is 0 while the value of the second bit forming the Q component is 1), and outputs the product as branch metric BM01. This branch metric BM01 corresponds to the code output 01 of the convolutional encoder 2.

The multiplier circuit 121-3 multiplies data X1 output from the selector 120-2 and data Y0 output from the selector 120-3 together, and outputs the result of this multiplication as branch metric BM10. That is, the multiplier circuit 121-3 calculates the product of metric data X1 for the value 1 of one of the bits forming the I component and metric data Y0 for the value 0 of one of the bits forming the Q component (the probability that the value of the first bit forming the I component is 1 while the value of the second bit forming the Q component is 0), and outputs the product as branch metric BM10. This branch metric BM10 corresponds to the code output 10 of the convolutional encoder 2.

The multiplier circuit 121-4 multiplies data X1 output from the selector 120-2 and data Y1 output from the selector 120-4 together, and outputs the result of this multiplication as branch metric BM11. That is, the multiplier circuit 121-4 calculates the product of metric data X1 for the value 1 of one of the bits forming the I component and metric data Y1 for the value 1 of one of the bits forming the Q component (the probability that the value of the first bit forming the I component is 1 while the value of the second bit forming the Q component is 1), and outputs the product as branch metric BM11. This branch metric BM11 corresponds to the code output 11 of the convolutional encoder 2. The subsequent operation of this section is the same as that of the section shown in FIG. 4.

As described above, Viterbi decoding is executed by the Viterbi decoder 7 to obtain reproduced data 38. Except for the aforementioned differences, the operation of the embodiment shown in FIG. 5 is the same as that shown in FIG. 2.

Figure 8:
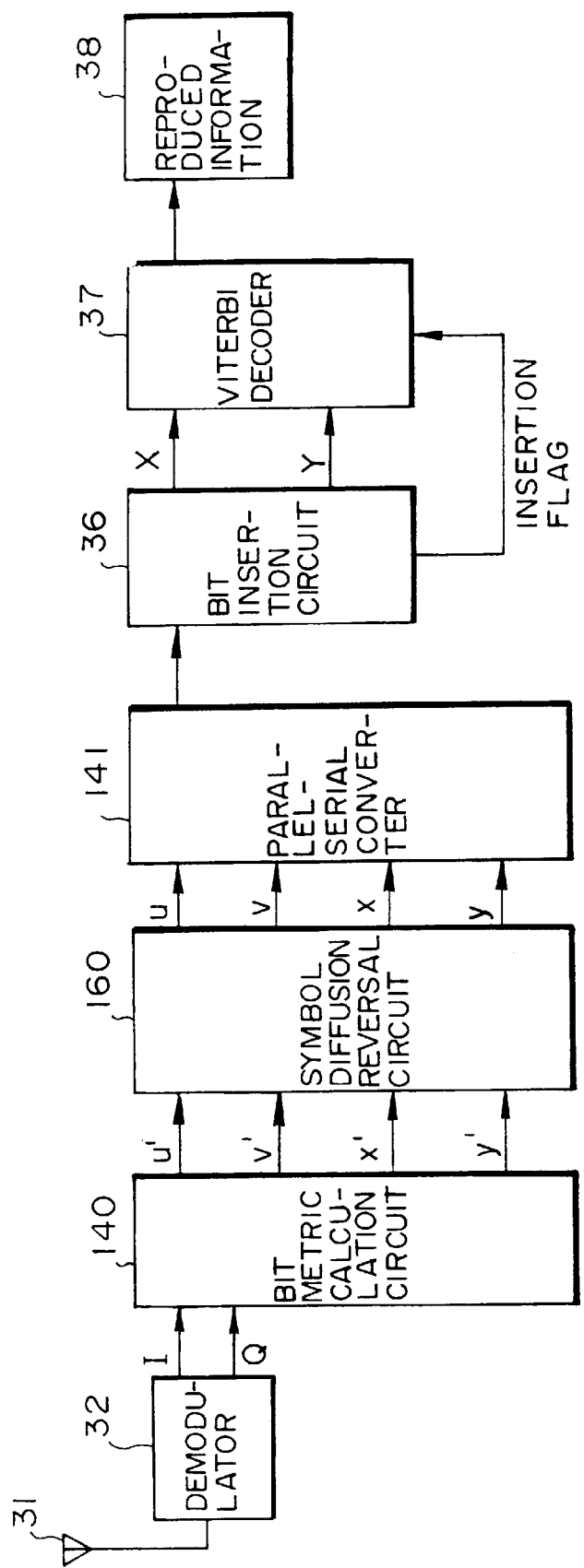
FIG. 8 is a block diagram showing the configuration of a data receiver which represents a third embodiment of the present invention.
Figure 9:
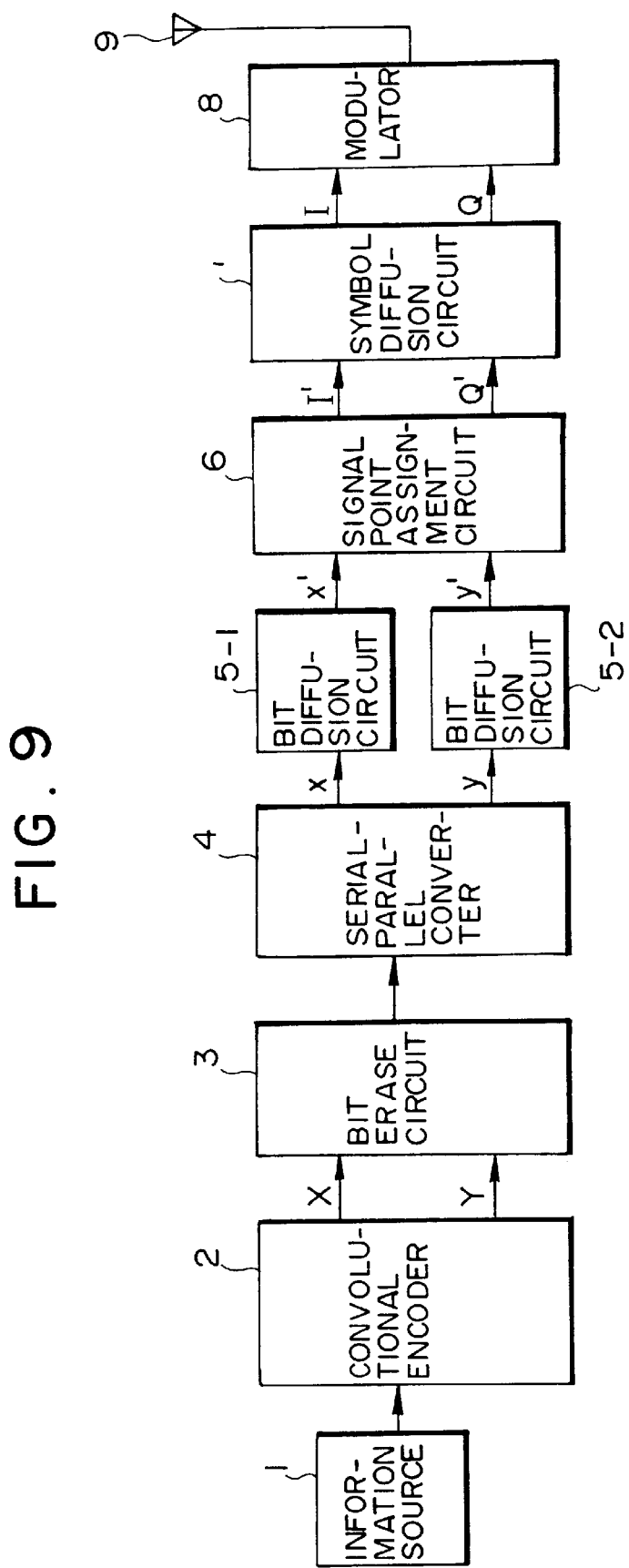
FIG. 9 is a block diagram showing the configuration of a conventional data transmitter.
Figure 10:
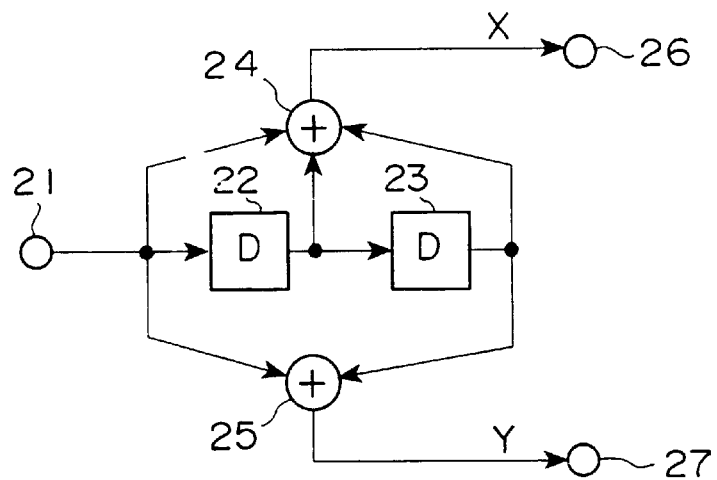
FIG. 10 is a block diagram showing the configuration of an example of the convolutional encoder shown in FIG. 9.

FIG. 8 shows a data receiver which represents a third embodiment of the present invention. In this embodiment, the symbol diffusion reversal circuit 160 is arranged after the metric calculation circuit 140. That is, after demodulation by the demodulator 32, metrics for the bits constituting each of the symbols are obtained by the metric calculation circuit 140, and the metrics are then processed by symbol diffusion reversal circuit 160. The configuration of this embodiment is the same as that shown in FIG. 5 in all other respects.

A signal received by antenna 31 is demodulated by demodulator 32, thereby extracting I and Q components of symbols. Metric calculation circuit 140 calculates metrics for the bits constituting the symbols on the basis of data of the I and Q components output from demodulator 32. Metric data (u', v', x', y') output from the metric calculation circuit 140 are:

u': a metric for the value 0 of the first bit denoted by each received signal;
v': a metric for the value 0 of the second bit denoted by the received signal;
x': a metric for the value 0 of the third bit denoted by the signal;, and
y': a metric for the value 0 of the fourth bit denoted by the signal.

Metric data (u', v', x', y') are then input into the symbol diffusion reversal circuit 160. Symbol diffusion reversal circuit 160 processes the input data by operation in a manner opposite to that of the symbol diffusion circuit 7 shown in FIGS. 1 and 17. If expressed by using the same N and G as those used with respect to the diffusion circuit, the diffusion reversal operation corresponding to the above-described diffusion circuit is the replacement of a vector formed of the group of metric data Si before diffusion reversal processing (S1, S2, . . . , Sn, . . . , SN−1) with a vector formed of the group of metric data S'i after diffusion reversal processing (S'1, S'2, . . . , S'k, . . . , S'N−1). In these expressions, Sn=S'k (n=G^k mod N).

Stated another way, the symbol diffusion reversal circuit interchanges bit metrics derived from certain received signals in the sequence of received signals with the bit metrics derived from other received signals in the sequence.

The data output from symbol diffusion reversal circuit 160 is input to parallel-serial converter 141 to undergo the same bit insertion and Viterbi decoding processing as that described above. The operation of this embodiment of the present invention is the same as that of the embodiment shown in FIG. 5 in all other respects.

In the embodiment shown in FIG. 8, the metric for each bit constituting symbols is calculated only with respect to the value 0 of the bit. However, the bit metric for each bit may be calculated as a pair, i.e., a first bit metric with respect to each value 0 and a second 1.

In the above-described embodiments, the arrangement shown in FIG. 7, using inverting circuits 131-1 and 131-2 and multiplier circuits 121-1 through 121-4, is used as a two-input Viterbi decoder 37. However, the arrangement shown in FIG. 4, using branch metric calculation circuits 63-1 through 63-4, may alternatively be used. In the case of the four-input Viterbi decoder 105 shown in FIG. 4, multiplier circuits 121-1 through 121-4 may be replaced with branch metric circuits 63-1 through 63-4 shown in FIG. 14.

In the above-described embodiments, data modulated in accordance with a 16-QAM modulation scheme is demodulated and decoded. However, the present invention is also useful with other multi-value multi-component modulation systems such as 64-QAM or 256-QAM in which each symbol denotes more than two bits. In the 16-QAM, 64-QAM and 256-QAM systems, each of I and Q components denotes two or more bits. The present invention also can be applied to 8-PSK modulation and still other multi-value, multi-component modulation systems. In some of these systems, one component may denote only one bit. Further, although conventional modulation systems use two orthogonal components, the present invention can be applied to modulation systems having a greater number of components in each transmitted signal. Multi-component modulation systems are also known as multi-phase modulation systems.

The present invention can be employed with any transmission medium. Thus, although the transmitters and receivers discussed above employ electromagnetic (radio) waves as the transmission medium, the invention can also be used with optical transmission media, such as in encoding and decoding data sent in a fiber optic transmission system.

Any other symbol diffusion algorithms, and the corresponding symbol diffusion reversal processes, can be used in place of the particular symbol diffusion processes and reversal processes used in the embodiments discussed above. Likewise, other bit erasing and bit inserting algorithms can be substituted for those shown. In still further embodiments, the transmitter may incorporate additional bit-level processing features such as bit diffusion as discussed above in connection with the QPSK system and FIGS. 8–20. For example, the transmitter of FIG. 1 may incorporate devices for reordering each of the sequences of bits u,v,x and y constituting the punctured convolutional code message, after the bit erase circuit but before the signal point assignment circuit. The receiver of FIG. 2 may be provided with devices for reordering sequences of bit metrics u0 and u1 in a manner inverse to the reordering applied to bit sequence u at the transmitter, whereas bit metric sequences v0 and v1 can be reordered inverse to the reordering of the corresponding bits v at the transmitter. The remaining bit metric sequences x0,x1 and y0,y1 can also be reordered in a manner inverse to the reordering of corresponding bit sequences x and y at the transmitter. Here again, because one bit metric, or one pair of bit metrics such as x0,x1 represents one bit, bit-level processing at the transmitter can be reversed by processing the bit metrics at the receiver. Alternatively, bit erasing can be omitted from the transmitter, and in this case the corresponding reversal process is omitted from the receiver.

The Viterbi decoders discussed above can be replaced by other types of decoders. Where a convolutional code is employed, the decoder most preferably is a most likely path decoder, i.e., a decoder which determines the content of the reproduced data be determining the most likely path or series of states represented by the received data. Also, although the receivers discussed above incorporate decoders which recover the original encoded message, the receiver can be provided as a component which supplies the sequences of bit metrics to a separate decoding device. The decoder circuit and other circuits described above can be replaced in whole or in part by programmable microprocessors programmed to perform equivalent functions.

The disclosure of the copending, commonly assigned United States Patent Application of Tamotsu Ikeda entitled DATA RECEIVER USING APPROXIMATED BIT METRICS and claiming priority of Japanese Patent Application P08-231746, and the disclosure of the copending, commonly assigned United States Patent Application of Tamotsu Ikeda entitled APPARATUS AND METHOD FOR RECEIVING DATA USING BIT METRICS and claiming priority of Japanese Patent Applications P08-231745 and P08-233058, both of said United States Patent Applications being filed on even date herewith, are hereby incorporated by reference herein.

For example, the applications incorporated by reference herein disclose additional forms of bit metric calculation circuits which can be utilized in the present invention. As set forth in greater detail in the aforementioned application entitled DATA RECEIVER USING APPROXIMATED BIT METRICS, a receiver may be arranged for multi-component signals representing symbols selected from a set of possible multi-component, multi-value symbols such as 16-QAM; 64-QAM or 256-QAM symbols, such that each component of each signal denotes values for a plurality of bits. Thus, two or more bits are associated with each component of the signal, and the value of each bit is denoted by the associated component. In this case, the data receiver may include means for determining the value of each component in each received signal and the bit metric calculation means may be arranged to set a value of a bit metric for each bit denoted by each signal based upon the value of the signal component associated with that bit. Thus, first, second and third ranges are defined for each bit. The value setting circuit is arranged to set the bit metric for each bit so that the bit metric has a predetermined maximum value when the signal component associated with the bit is in the first range defined for that bit; so that the bit metric has a predetermined minimum value when the component associated with the bit is in the second range defined for the bit and so that the bit metric has an intermediate value, between the maximum and minimum values, when the component reassociated with the bit is in the third range defined for the bit. The bit metric may be determined by interpolation when the value of the component is in the third range. Different ranges are defined for each of the bits associated with a given component.

Also, the aforementioned application entitled APPARATUS AND METHOD FOR RECEIVING DATA USING BIT METRICS describes additional bit metric calculation circuits in which the bit metric for a particular bit is determined by determining, form the components of each received signal, the probability that the received signal represents each of the possible symbols, and then calculating a bit metric for a particular bit from the probabilities for those possible symbols having a component denoting a predetermined value of that bit. The bit metric may be the sum of these probabilities or some function of the sum.

As described in both of said copending applications, the bit metric may be a logarithmic function, such as the logarithm of the sum of probabilities or the product of such logarithm and −1. Also, as described in said copending applications, the circuits which directly calculate the bit metrics may be replaced by memories with stored values of the bit metrics and reading circuits which read out the stored values. The values of the components in the incoming signals may be supplied as addresses to the reading circuit, and the bit metrics stored at such addresses are read out of the memory. The arrangement of bit metrics and addresses desirably is selected so that the value read out of the memory for any given values of the received signal components will be substantially equal to the value arrived at by direct calculation using the other methods discussed above. Thus, the calculation is performed by means of a lookup table.

As these and other variations and combinations of the features discussed above can be utilized without departing from the present invention, the foregoing description of the preferred embodiments should be taken as illustrating, rather than as limiting, the invention as defined by the claims.

What is claimed is:

1. A data receiver for receiving a series of received signals, each received signal incorporating a plurality of components, each such received signal denoting values for more than two bits of data in a message encoded in a punctured convolutional code, said data receiver comprising:

bit metric calculation means for calculating at least one bit metric for each of the bits of data denoted by each said signal, to provide one or more sequences of bit metrics; and bit insertion means for performing bit insertion processing in the sequences of bit metrics in accordance with a predetermined rule to thereby form one or more augmented sequences of bit metrics.

2. A receiver as claimed in claim 1 further comprising decoding means for decoding the data by processing said one or more augmented sequences of bit metrics.

3. A receiver as claimed in claim 2 wherein said decoding means including means for deconvoluting said augmented sequences of bit metrics.

4. A receiver as claimed in claim 3 wherein said means for deconvoluting includes means for deconvoluting according to a most likelihood decoding scheme.

5. A receiver as claimed in claim 3 wherein said means for deconvoluting includes means for deconvoluting according to a Viterbi decoding scheme.

6. A data receiver as claimed in claim 5 wherein said bit metric calculation means is operative to calculate said bit metrics so that each such bit metric represents the probability that a bit has a particular value.

7. A data receiver according to claim 6, wherein said metric calculation means calculates a first bit metric for each bit representing the probability that such bit has a first value and a second bit metric for each bit representing the probability that such bit has a second value.

8. A data receiver according to claim 1, further comprising symbol diffusion reversal means for performing symbol diffusion reversal processing to provide an altered series of said received signals, wherein said bit metric calculation means is operative to calculate said bit metrics from said altered series of received signals provided by said symbol diffusion reversal means.

9. A data receiver as claimed in claim 8 wherein said symbol diffusion reversal means includes means for interchanging components of certain received signals in an incoming sequence of received signals with components of other received signals in the incoming sequence according to a predetermined pattern to provide said altered sequence of received signals.

10. A data receiver according to claim 1, further comprising symbol diffusion reversal means for performing symbol diffusion reversal processing on said sequences of bit metrics output by said metric calculation means.

11. A data receiver as claimed in claim 10 wherein said symbol diffusion reversal means includes means for interchanging bit metrics derived from certain received signals with bit metrics derived from other received signals according to a predetermined pattern.

12. A method of receiving a series of received signals, each received signal incorporating a plurality of components, each such received signal denoting values for more than two bits of data in a message encoded in a punctured convolutional code, said method comprising the steps of:

calculating at least one bit metric for each of the bits of data denoted by each said signal, to provide one or more sequences of bit metrics; and performing bit insertion processing in the sequences of bit metrics in accordance with a predetermined rule to thereby form one or more augmented sequences of bit metrics.

13. A method as claimed in claim 12 further comprising the step of decoding the data by processing said one or more augmented sequences of bit metrics.

14. A method as claimed in claim 13 wherein said decoding step includes the step of deconvoluting said one or more augmented sequences of bit metrics.

15. A method as claimed in claim 14 wherein said deconvoluting step includes the step of deconvoluting according to a most likelihood decoding scheme.

16. A method as claimed in claim 14 wherein said deconvoluting step includes the step of deconvoluting according to a Viterbi decoding scheme.

17. A method as claimed in claim 16 wherein said bit metric calculation step is performed so as to calculate said bit metrics so that each such bit metric represents the probability that a bit has a particular value.

18. A method according to claim 17, wherein said metric calculation step includes the step of calculating a first bit metric for each bit representing the probability that such bit has a first value and a second bit metric for each bit representing the probability that such bit has a second value.

19. A method according to claim 1, further comprising the step of performing symbol diffusion reversal processing to provide an altered series of said received signals, wherein said bit metric calculation step includes the step of calculating said bit metrics from said altered series of received signals provided by said symbol diffusion reversal means.

20. A method as claimed in claim 19 wherein said step of performing symbol diffusion reversal processing includes the step of interchanging components of certain received signals in an incoming sequence of received signals with components of other received signals in the incoming sequence according to a predetermined pattern to provide said altered sequence of received signals.

21. A method according to claim 1, further comprising the step of performing symbol diffusion reversal processing on said sequences of bit metrics prior to said step of performing bit insertion processing.

22. A data receiver as claimed in claim 21 wherein said symbol diffusion reversal processing step includes the step of interchanging bit metrics derived from certain received signals with bit metrics derived from other received signals according to a predetermined pattern.

23. A data receiver for receiving a series of received signals, each received signal incorporating a plurality of components, each such received signal denoting values for more than two bits of data in a message encoded in a punctured convolutional code, said data receiver comprising:

a bit metric calculation circuit having one or more input connections for received signals and one or more output connections, said bit metric calculation circuit being operative to calculate at least one bit metric for each of the bits of data denoted by each said signal and provide one or more sequences of bit metrics at said one or more output connections; and a bit insertion circuit having one or more input connections connected to said one or more output connections of said bit metric calculation circuit, said bit insertion circuit having one or more output connections, said bit insertion circuit being operative to insert dummy data into said one or more sequences of bit metrics in accordance with a predetermined rule to thereby form one or more augmented sequences of bit metrics at said one or more output connections f said bit insertion circuit.

24. A receiver as claimed in claim 23 further comprising a decoder having one or more input connections connected to said output connections of said bit inertion circuit.

25. A receiver as claimed in claim 24 wherein said decoder is a Viterbi decoder.

26. A data receiver as claimed in claim 23 wherein said bit metric calculation circuit is constructed and arranged to calculate said bit metrics so that each such bit metric represents the probability that a bit has a particular value.

27. A data receiver according to claim 26, wherein said bit metric calculation circuit calculates a first bit metric for each bit representing the probability that such bit has a first value and a second bit metric for each bit representing the probability that such bit has a second value.

28. A data receiver according to claim 1, further comprising a symbol diffusion reversal circuit having one or more input connections and one or more output connections connected to said one or more input connections of said bit metric calculation circuit, said symbol diffusion reversal circuit being adapted to reorder received signals and provide an altered series of said received signals at the output connections of said symbol diffusion reversal circuit, said bit metric calculation circuit being operative to calculate said bit metrics from said altered series of received signals provided by said symbol diffusion reversal circuit.

29. A data receiver as claimed in claim 28 wherein said symbol diffusion reversal circuit is constructed and arranged to interchange components of certain received signals in an incoming sequence of received signals supplied to the one or more input connections of the symbol diffusion reversal circuit with components of other received signals in the incoming sequence according to a predetermined pattern to provide said altered sequence of received signals.

30. A data receiver according to claim 23, further comprising a symbol diffusion reversal circuit having one or more input connections connected to the output connections of the bit metric calculation circuit, said symbol diffusion reversal circuit being adapted to interchange bit metrics derived from certain received signals with bit metrics derived from other received signals according to a predetermined pattern.

* * * * *

UNITED STATES PATENT AND TRADEMARK OFFICE
CERTIFICATE OF CORRECTION

PATENT NO. : 6,324,224 B1
DATED : November 27, 2001
INVENTOR(S) : Tamotsu Ikeda

It is certified that error appears in the above-identified patent and that said Letters Patent is hereby corrected as shown below:

Column 3,
Line 28, "is assumed" should read -- are assumed --.

Column 5,
Line 28, "channel were" should read -- channel was --.

Column 22,
Line 5, "y2" should read -- y2. --.

Column 26,
Line 68, "means including" should read -- means includes --.

Column 28,
Line 49, "connections f" should read -- connections of --.
Line 53, "bit inertion" should read -- bit insertion --.

Signed and Sealed this

Second Day of April, 2002

*Attest:*

JAMES E. ROGAN
*Attesting Officer*     *Director of the United States Patent and Trademark Office*